United States Patent
Lee et al.

(10) Patent No.: US 11,227,855 B2
(45) Date of Patent: Jan. 18, 2022

(54) SEMICONDUCTOR PACKAGE

(71) Applicant: SAMSUNG ELECTRONICS CO., LTD., Suwon-si (KR)

(72) Inventors: Jang-woo Lee, Asan-si (KR); Un-byoung Kang, Hwaseong-si (KR); Ji-hwang Kim, Cheonan-si (KR); Jong-bo Shim, Asan-si (KR); Young-kun Jee, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/407,429

(22) Filed: May 9, 2019

(65) Prior Publication Data

US 2020/0118972 A1 Apr. 16, 2020

(30) Foreign Application Priority Data

Oct. 16, 2018 (KR) .................. 10-2018-0123270

(51) Int. Cl.
*H01L 21/00* (2006.01)
*H01L 25/065* (2006.01)
(Continued)

(52) U.S. Cl.
CPC ........ *H01L 25/0652* (2013.01); *H01L 21/563* (2013.01); *H01L 21/565* (2013.01); *H01L 23/3128* (2013.01); *H01L 23/481* (2013.01); *H01L 24/09* (2013.01); *H01L 24/17* (2013.01); *H01L 24/33* (2013.01); *H01L 24/49* (2013.01);
(Continued)

(58) Field of Classification Search
CPC . H01L 25/0652; H01L 21/563; H01L 21/565; H01L 23/3128; H01L 23/481; H01L 24/09; H01L 24/17; H01L 24/33; H01L 24/49; H01L 24/73
See application file for complete search history.

(56) References Cited

U.S. PATENT DOCUMENTS

| 8,362,624 B2 | 1/2013 | Kang et al. |
| 8,691,628 B2 | 4/2014 | Tane et al. |

(Continued)

FOREIGN PATENT DOCUMENTS

| JP | 2006-066816 A | 3/2006 |
| JP | 2008-084972 A | 4/2008 |

(Continued)

*Primary Examiner* — Mounir S Amer
*Assistant Examiner* — Alexander Belousov
(74) *Attorney, Agent, or Firm* — Lee IP Law, P.C.

(57) ABSTRACT

A semiconductor package includes a first package substrate, a first semiconductor chip on the first package substrate, a plurality of first chip connection units to connect the first package substrate to the first semiconductor chip, an interposer on the first semiconductor chip, the interposer having a width greater than a width of the first semiconductor chip in a direction parallel to an upper surface of the first package substrate, and an upper filling layer including a center portion and an outer portion, the center portion being between the first semiconductor chip and the interposer, and the outer portion surrounding the center portion and having a thickness greater than a thickness of the center portion in a direction perpendicular to the upper surface of the first package substrate.

14 Claims, 30 Drawing Sheets

(51) Int. Cl.
  *H01L 23/48* (2006.01)
  *H01L 23/00* (2006.01)
  *H01L 23/31* (2006.01)
  *H01L 21/56* (2006.01)

(52) U.S. Cl.
  CPC .... *H01L 24/73* (2013.01); *H01L 2224/73204* (2013.01); *H01L 2224/73265* (2013.01)

(56) References Cited

U.S. PATENT DOCUMENTS

| | | |
|---|---|---|
| 8,896,130 B2 | 11/2014 | Liu et al. |
| 9,093,441 B2 | 7/2015 | Kim et al. |
| 9,293,443 B2 | 3/2016 | Nam |
| 9,418,974 B2 | 8/2016 | Ng et al. |
| 9,461,029 B2 | 10/2016 | Jang et al. |
| 9,515,057 B2 * | 12/2016 | Ma ................... H01L 25/0657 |
| 2004/0222508 A1 | 11/2004 | Aoyagi |
| 2005/0156323 A1 | 7/2005 | Tokunaga |
| 2012/0199960 A1 | 8/2012 | Cosue et al. |
| 2013/0015589 A1 | 1/2013 | Liao et al. |
| 2013/0099393 A1 | 4/2013 | Jeong et al. |
| 2015/0311185 A1 * | 10/2015 | Ng .......................... H01L 24/85 257/784 |

FOREIGN PATENT DOCUMENTS

| | | |
|---|---|---|
| JP | 2013-172069 A | 9/2013 |
| JP | 6242763 B2 | 12/2017 |
| KR | 10-2011-0138945 A | 12/2011 |
| KR | 10-2016-0001912 A | 1/2016 |

\* cited by examiner

US 11,227,855 B2

SEMICONDUCTOR PACKAGE

CROSS-REFERENCE TO RELATED APPLICATION

Korean Patent Application No. 10-2018-0123270, filed on Oct. 16, 2018, in the Korean Intellectual Property Office, and entitled: "Semiconductor Package," is incorporated by reference herein in its entirety.

BACKGROUND

1. Field

Example embodiments relate to a semiconductor package, and more particularly, to a package-on-package.

2. Description of the Related Art

To meet the need for miniaturized and highly integrated semiconductor packages, a package-on-package has been developed. The package-on-package has a structure where one sub-package is stacked on another sub-package. Therefore, the package-on-package may occupy a small area and may enable semiconductor packages to be miniaturized and highly integrated.

SUMMARY

According to an aspect of embodiments, there is provided a semiconductor package including a first package substrate, a first semiconductor chip on the first package substrate, a plurality of first chip connection units connecting the first package substrate to the first semiconductor chip, an interposer on the first semiconductor chip, the interposer having a width greater than a width of the first semiconductor chip in a direction parallel to an upper surface of the first package substrate, and an upper filling layer including a center portion between the first semiconductor chip and the interposer and an outer portion surrounding the center portion and having a thickness greater than a thickness of the center portion in a direction perpendicular to the upper surface of the first package substrate.

According to another aspect of embodiments, there is provided a semiconductor package including a first package substrate, a first semiconductor chip on the first package substrate, a plurality of first chip connection units connecting the first package substrate to the first semiconductor chip, an interposer on the first semiconductor chip, the interposer having a width greater than a width of the first semiconductor chip in a direction parallel to an upper surface of the first package substrate, an upper filling layer filling a space between the interposer and the first semiconductor chip, and a lower filling layer including a center portion filling a space between the first semiconductor chip and the first package substrate and an outer portion surrounding the center portion and having a thickness greater than a thickness of the center portion in a direction perpendicular to the upper surface of the first package substrate.

According to yet another aspect of embodiments, there is provided a semiconductor package including a first sub-package including a first package substrate, a first semiconductor chip on the first package substrate, a plurality of first chip connection units between the first package substrate and the first semiconductor chip, an interposer on the first semiconductor chip and having a width greater than a width of the first semiconductor chip in a direction parallel to an upper surface of the first package substrate, an upper filling layer filling a space between the interposer and the first semiconductor chip, and a lower filling layer filling a space between the first semiconductor chip and the first package substrate; and a second sub-package including a plurality of inter-package connection units on the interposer, a second package substrate on the plurality of inter-package connection units, at least one second semiconductor chip on the second package substrate, and a second molding unit surrounding the at least one second semiconductor chip and covering an upper surface of the second package substrate, wherein at least one of the upper filling layer and the lower filling layer is in contact with a sidewall of the first semiconductor chip.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
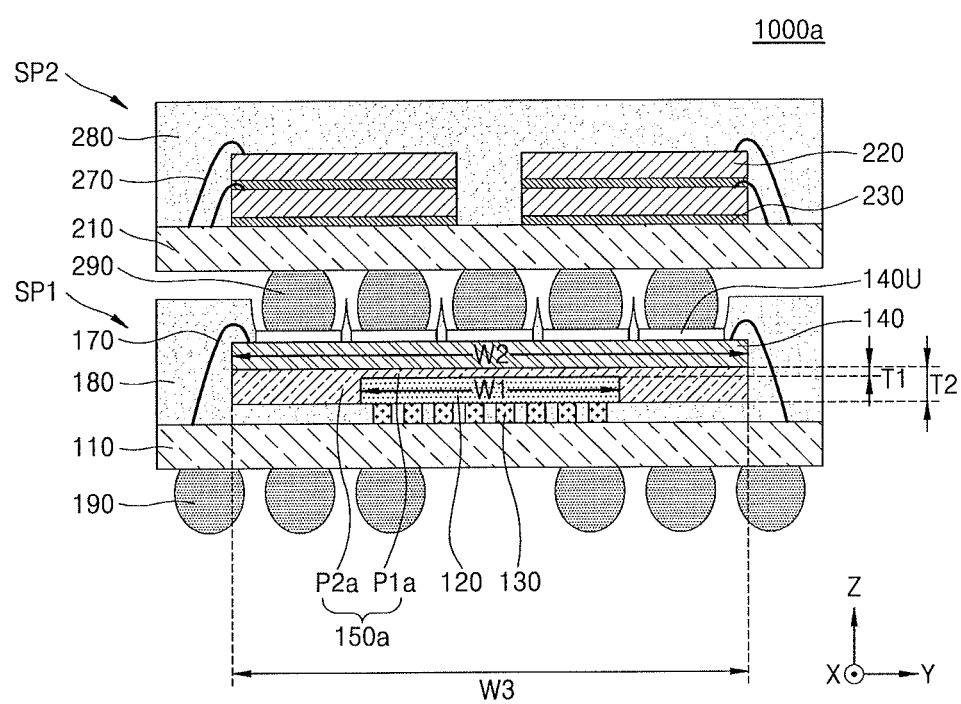
FIG. 1A illustrates a cross-sectional view of a semiconductor package according to an embodiment.

FIG. 1A is a cross-sectional view illustrating a semiconductor package 1000a according to an embodiment.

Referring to FIG. 1A, the semiconductor package 1000a may include a first sub-package SP1 and a second sub-package SP2. The second sub-package SP2 may be stacked on the first sub-package SP1. For example, the semiconductor package 1000a may be a package-on-package.

The first sub-package SP1 may include a first package substrate 110, a first semiconductor chip 120, a plurality of first chip connection units 130, an interposer 140, an upper filling layer 150a, a plurality of wires 170, and a first molding unit 180.

The first package substrate 110 may be a printed circuit board (PCB). The PCB may be a rigid PCB or a flexible PCB. The first package substrate 110 may include a substrate base layer, a plurality of lower connection pads, a plurality of upper connection pads, a plurality of conductive lines, a plurality of vias, and a solder resist layer.

The substrate base layer in the first package substrate 110 may include, e.g., phenol resin, epoxy resin, polyimide resin, or a combination thereof. For example, the substrate base layer may include flame retardant 4 (FR4), tetrafunctional epoxy, polyphenylene ether, epoxy/polyphenylene oxide, bismaleimide triazine (BT), thermount, cyanate ester, polyimide, or a liquid crystal polymer. In some embodiments, the first package substrate 110 may be a multi-layer PCB where the substrate base layer is configured with a plurality of layers.

The plurality of lower connection pads in the first package substrate 110 may be disposed on a lower surface of the substrate base layer, and the plurality of upper connection pads may be disposed on an upper surface of the substrate base layer. The plurality of lower connection pads may be connected to a plurality of external connection units 190, and the plurality of upper connection pads may be connected to the plurality of first chip connection units 130 and the plurality of wires 170. The plurality of lower connection pads and the plurality of upper connection pads may each include, e.g., copper (Cu), nickel (Ni), aluminum (Al), silver (Ag), gold (Au), or a combination thereof.

The plurality of conductive lines and the plurality of vias in the first package substrate 110 may be disposed in the substrate base layer and on a surface of the substrate base layer. The plurality of conductive lines and the plurality of vias may connect the plurality of lower connection pads and the plurality of upper connection pads. The plurality of conductive lines and the plurality of vias may each include, e.g., Cu, Ni, Al, Ag, Au, or a combination thereof.

The solder resist layer of the first package substrate 110 may be disposed on each of the upper surface and the lower surface of the substrate base layer. However, the solder resist layer may not cover the plurality of upper connection pads and the plurality of lower connection pads.

The first semiconductor chip 120 may be disposed on the first package substrate 110. The first semiconductor chip 120 may have a first width W1 in a direction (e.g., in a Y direction) parallel to an upper surface of the first package substrate 110. The first semiconductor chip 120 may be a logic chip or a memory chip. The logic chip may be, e.g., a memory controller chip, a central processing unit (CPU) chip, a graphic processing unit (GPU) chip, or an application processor (AP) chip. The memory chip may be, e.g., a dynamic random-access memory (DRAM) chip, a static random-access memory (SRAM) chip, a flash memory chip, an electrically erasable and programmable read-only memory (EEPROM) chip, a phase-change random access memory (PRAM) chip, a magnetic random-access memory (MRAM) chip, or a resistive random-access memory (RRAM) chip.

The plurality of first chip connection units 130 may connect the first semiconductor chip 120 to the first package substrate 110. The plurality of first chip connection units 130 may be, e.g., a plurality of bumps. In this case, the plurality of first chip connection units 130 may be disposed between the first semiconductor chip 120 and the first package substrate 110. The plurality of first chip connection units 130 may each include, e.g., Au, Cu, Ni, tin (Sn), lead (Pb), or a combination thereof.

The interposer 140 may be disposed on the first semiconductor chip 120, e.g., the first semiconductor chip 120 may be centered with respect to the interposer 140. The interposer 140 may connect the first package substrate 110 to the second package substrate 210. The interposer 140 may have a second width W2 in the direction (e.g., in the Y direction) parallel to the upper surface of the first package substrate 110. The second width W2 of the interposer 140 may be greater than the first width W1 of the first semiconductor chip 120, e.g., the interposer 140 may overhang over each side of the first semiconductor chip 120.

The interposer 140 may include an interposer base, a plurality of connection pads 140U, and a plurality of conductive lines. The interposer base may include, e.g., an organic material, glass, ceramic, or a semiconductor. The interposer base may include, e.g., silicon (Si). The plurality of connection pads 140U may be disposed on an upper surface of the interposer base. The plurality of conductive lines may connect the plurality of connection pads 140U. The plurality of connection pads 140U and the plurality of conductive lines may each include, e.g., Cu, Ni, Al, Ag, Au, or a combination thereof.

The upper filling layer 150a may be disposed between the first package substrate 110 and the interposer 140. The upper filling layer 150a may be spaced apart from the first package substrate 110. The upper filling layer 150a may contact a lower surface of the interposer 140 and the upper surface of the first semiconductor chip 120, e.g., the upper filling layer 150a may contact the entire lower surface of the interposer 140 and the entire upper surface of the first semiconductor chip 120. In some embodiments, the upper filling layer 150a may contact the whole upper surface of the first semiconductor chip 120 and the whole lower surface of the interposer 140. The upper filling layer 150a may contact a sidewall of the first semiconductor chip 120 to cover the sidewall of the first semiconductor chip 120. The upper filling layer 150a may have a third width W3 in the direction (e.g., in the Y direction) parallel to the upper surface of the first package substrate 110. In some embodiments, the third width W3 of the upper filling layer 150a may be the same as the second width W2 of the interposer 140. For example, as illustrated in FIG. 1A, the third width W3 of the upper filling layer 150a may be measured along a top surface of the upper filling layer 150a.

The upper filling layer 150a may include a center portion P1a and an outer portion P2a. The center portion P1a and the outer portion P2a of the upper filling layer 150a may be provided as one, e.g., integral, body, e.g., as a single and seamless unit formed simultaneously of the same material. For example, the center portion P1a of the upper filling layer 150a may be a portion, e.g., completely, filling a space between the first semiconductor chip 120 and the interposer 140. For example, the outer portion P2a of the upper filling layer 150a may be a portion extending from and peripheral to the center portion P1a, e.g., extending from the center portion P1a along a remainder of the bottom surface of the interposer 140 and along an entire sidewall of the first semiconductor chip 120.

The center portion P1a of the upper filling layer 150a may be disposed between the first semiconductor chip 120 and the interposer 140 and may contact the upper surface of the first semiconductor chip 120 and the lower surface of the interposer 140. The outer portion P2a of the upper filling layer 150a may surround the, e.g., entire perimeter of the, center portion P1a and may contact the lower surface of the interposer 140. In some embodiments, the outer portion P2a of the upper filling layer 150a may contact the sidewall of the first semiconductor chip 120 to cover the sidewall of the first semiconductor chip 120. In some embodiments, a lower surface of the outer portion P2a of the upper filling layer 150a and the lower surface of the first semiconductor chip 120 may be disposed in the same level, e.g., level with each other. For example, a height of the lower surface of the outer portion P2a of the upper filling layer 150a in a direction (e.g., in a Z direction) vertical to the upper surface of the first package substrate 110 from the first package substrate 110 may be the same as that of the lower surface of the first semiconductor chip 120 in the direction (e.g., in the Z direction) vertical to the upper surface of the first package substrate 110 from the first package substrate 110.

The center portion P1a of the upper filling layer 150a may have a first thickness T1 in the direction (e.g., in the Z direction) vertical to the upper surface of the first package substrate 110, and the outer portion P2a of the upper filling layer 150a may have a second thickness T2 in the direction (e.g., in the Z direction) vertical to the upper surface of the first package substrate 110. The second thickness T2 may be greater than the first thickness T1. A thickness of the outer portion P2a of the upper filling layer 150a overhanging the first semiconductor chip 120 may be greater than that of the center portion P1a of the upper filling layer 150a, thereby preventing deflection from occurring in an overhung portion of the interposer 140.

The upper filling layer 150a may include a film on die (FOD) or a die attachment film (DAF). For example, the upper filling layer 150a may be formed by curing the FOD or the DAF. The upper filling layer 150a may include, e.g., an epoxy-based organic material.

The plurality of wires 170 may connect the interposer 140 to the first package substrate 110. The plurality of wires 170 may extend, e.g., from an upper surface of the interposer 140 to the upper surface of the first package substrate 110. The plurality of wires 170 may each include, e.g., Au, Cu, Ag, Al, or a combination thereof.

The first molding unit 180 may surround the first semiconductor chip 120, the plurality of first chip connection units 130, the plurality of wires 170, the upper filling layer 150a, and the interposer 140, and may cover the upper surface of the first package substrate 110. For example, as illustrated in FIG. 1A, the first molding unit 180 may surround and entire perimeter of the interposer 140 with the upper filling layer 150a, and may fill a space between a bottom surface of the upper filling layer 150a and the top surface of the first package substrate 110, as well as spaced between adjacent first chip connection units 130.

The first molding unit 180 may include a plurality of openings which expose the plurality of connection pads 140U of the interposer 140 in order for an inter-package connection unit 290 to contact the interposer 140. The first molding unit 180 may include, e.g., thermocurable resin, thermoplastic resin, ultraviolet (UV)-curable resin, or a combination thereof. The first molding unit 180 may include, e.g., epoxy resin, silicon resin, or a combination thereof. The first molding unit 180 may include, e.g., an epoxy mold compound (EMC).

The semiconductor package 1000a may further include the external connection unit 190. The external connection unit 190 may be disposed on the lower surface of the first package substrate 110. The external connection unit 190 may connect the semiconductor package 1000a to an external circuit. The external connection unit 190 may include, e.g., Au, Cu, Ni, Sn, Pb, or a combination thereof. The external connection unit 190 may include, e.g., a solder ball.

The second sub-package SP2 may include a second package substrate 210, at least one second semiconductor chip 220, an adhesive layer 230, a plurality of second chip connection units 270, a second molding unit 280, and the inter-package connection unit 290.

The second package substrate 210 may be a PCB. The second package substrate 210 may be positioned over, e.g., to overlap a top of, the first sub-package SP1.

The at least one second semiconductor chip 220 may be disposed on the second package substrate 210, e.g., the second package substrate 210 may be between the at least one second semiconductor chip 220 and the first sub-package SP1. The second semiconductor chip 220 may be a logic chip or a memory chip. In some embodiments, the second semiconductor chip 220 may be a semiconductor chip of a kind which differs from the first semiconductor chip 120. For example, the second semiconductor chip 220 may be a memory chip, and the first semiconductor chip 120 may be a logic chip. In FIG. 1, four second semiconductor chips 220 are illustrated. However, the number of second semiconductor chips 220 included in the second sub-package SP2 is not limited to four and may be variously changed. In some embodiments, two or more second semiconductor chips 220 may be stacked on top of each other in a vertical direction (e.g., in the Z direction). In some embodiments, two or more second semiconductor chips 220 may be disposed on the second package substrate 210 in a horizontal direction (e.g., in the XY plane) and may be spaced apart from one another, e.g., in the X and/or Y directions.

The second semiconductor chip 220 may be attached on the second package substrate 210, e.g., and/or to a bottom of another second semiconductor chip 220, by using the adhesive layer 230. The adhesive layer 230 may include, e.g., a DAF, a nonconductive film (NCF), or a nonconductive paste (NCP).

The plurality of second chip connection units 270 may connect the second semiconductor chip 220 to the second package substrate 210. Each of the plurality of second chip connection units 270 may be, e.g., a wire. The plurality of second chip connection units 270 may each include, e.g., Au, Cu, Ag, Al, or a combination thereof.

The second molding unit 280 may surround the second semiconductor chip 220 and the plurality of second chip connection units 270, and may cover an upper surface of the second package substrate 210. The second molding unit 280 may include, e.g., thermocurable resin, thermoplastic resin, UV-curable resin, or a combination thereof. The second molding unit 280 may include, e.g., epoxy resin, silicon resin, or a combination thereof. The second molding unit 280 may include, e.g., an EMC.

The plurality of inter-package connection units 290 may be disposed between a lower surface of the second package substrate 210 and the interposer 140. The plurality of inter-package connection units 290 may be respectively disposed in the openings included in the first molding unit 180. The plurality of inter-package connection units 290 may contact the plurality of connection pads 140U of the interposer 140, respectively, exposed by the first molding unit 180. The plurality of inter-package connection units 290 may connect the first sub-package SP1 to the second sub-package SP2. Each of the plurality of inter-package connection units 290 may include, e.g., Au, Cu, Ni, Sn, Pb, or a combination thereof. Each of the plurality of inter-package connection units 290 may include, e.g., a solder ball.

In the semiconductor package 1000a according to an embodiment, in comparison with the center portion P1a of the upper filling layer 150a, the outer portion P2a of the upper filling layer 150a may be substantially thicker in a direction along a normal to the first package substrate 110. Since the thickness of the outer portion P2a of the upper filling layer 150a is relatively large, an edge portion of the interposer 140 overhanging the first semiconductor chip 120 may be sufficiently supported by the outer portion P2a, thereby preventing or substantially reducing deflection, e.g., bending, of the edge portion of the interposer 140 toward the first package substrate 110.

Figure 1B:
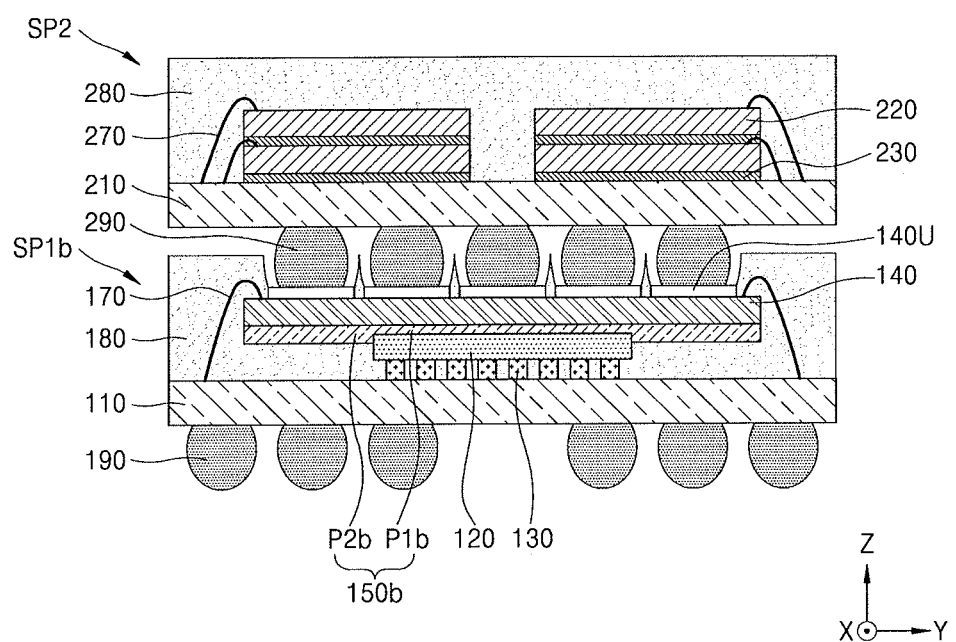
FIG. 1B illustrates a cross-sectional view of a semiconductor package according to an embodiment.

FIG. 1B is a cross-sectional view illustrating a semiconductor package 1000b according to an embodiment. Hereinafter, a difference between the semiconductor package 1000b illustrated in FIG. 1B and the semiconductor package 1000a illustrated in FIG. 1A will be described.

Referring to FIG. 1B, the semiconductor package 1000b may include a first sub-package SP1b and the second sub-package SP2. That is, the semiconductor package 1000b may include the first sub-package SP1b instead of the first sub-package SP1 of the semiconductor package 1000a illustrated in FIG. 1A.

In detail, as illustrated in FIG. 1B, the first sub-package SP1b may include an upper filling layer 150b instead of the upper filling layer 150a included in the first sub-package SP1 illustrated in FIG. 1A. The upper filling layer 150b may include a center portion P1b and an outer portion P2b. The outer portion P2b of the upper filling layer 150b may cover, e.g., only, a portion of a sidewall of a first semiconductor chip 120. A lower surface of the outer portion P2b of the upper filling layer 150b may be disposed at a level which is higher in position than a lower surface of the first semiconductor chip 120, e.g., relative to the top surface of the first package substrate 110. That is, a height of the lower surface of the outer portion P2b of the upper filling layer 150b in a direction (e.g., in a Z direction) vertical to an upper surface of a first package substrate 110 from the upper surface of the first package substrate 110 may be larger than that of a lower surface of the first semiconductor chip 120 in the direction (e.g., in the Z direction) vertical to the upper surface of the first package substrate 110 from the upper surface of the first package substrate 110.

Figure 1C:
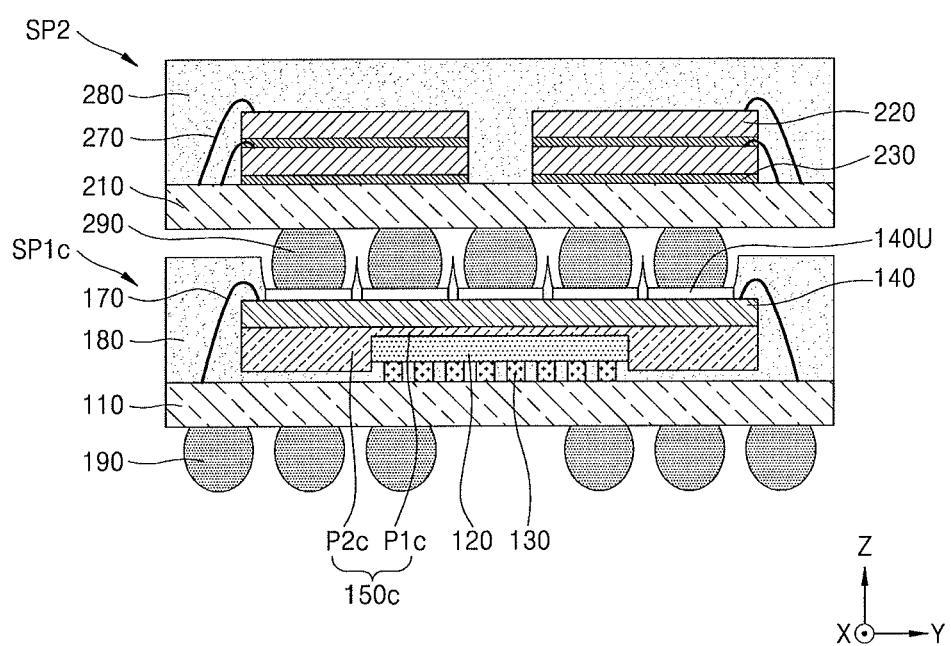
FIG. 1C illustrates a cross-sectional view of a semiconductor package according to an embodiment.

FIG. 1C is a cross-sectional view illustrating a semiconductor package 1000c according to an embodiment. Hereinafter, a difference between the semiconductor package 1000c illustrated in FIG. 1C and the semiconductor package 1000a illustrated in FIG. 1A will be described.

Referring to FIG. 1C, the semiconductor package 1000c may include a first sub-package SP1c and the second sub-package SP2. That is, the semiconductor package 1000c may include the first sub-package SP1c instead of the first sub-package SP1 of the semiconductor package 1000a illustrated in FIG. 1A.

In detail, as illustrated in FIG. 1C, the first sub-package SP1c may include an upper filling layer 150c instead of the upper filling layer 150a included in the first sub-package SP1 illustrated in FIG. 1A. The upper filling layer 150c may include a center portion P1c and an outer portion P2c. A lower surface of the outer portion P2c of the upper filling layer 150c may be disposed at a level which is lower in position than a lower surface of a first semiconductor chip 120, e.g., relative to the top surface of the first package substrate 110. That is, a height of the lower surface of the outer portion P2c of the upper filling layer 150c in a direction (e.g., in the Z direction) vertical to an upper surface of the first package substrate 110 from the upper surface of the first package substrate 110 may be less than that of a lower surface of the first semiconductor chip 120 in the direction (e.g., in the Z direction) vertical to the upper surface of the first package substrate 110 from the upper surface of the first package substrate 110. However, the outer portion P2c of the upper filling layer 150c may be spaced apart from the first package substrate 110.

Figure 2:
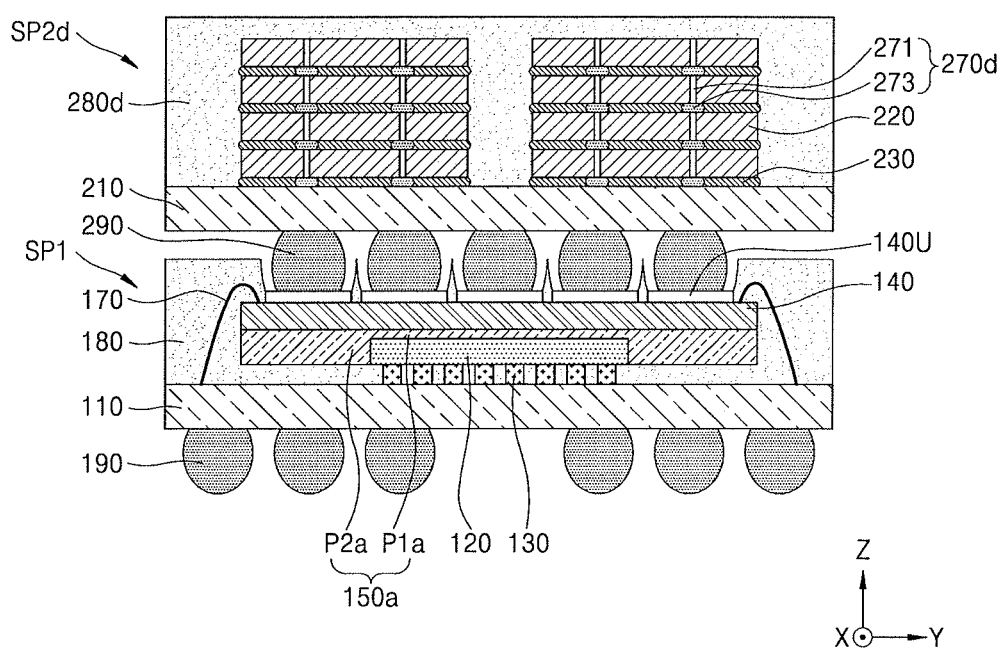
FIG. 2 illustrates a cross-sectional view of a semiconductor package according to an embodiment.

FIG. 2 is a cross-sectional view illustrating a semiconductor package 2000 according to an embodiment. Hereinafter, a difference between the semiconductor package 2000 illustrated in FIG. 2 and the semiconductor package 1000a illustrated in FIG. 1A will be described.

Referring to FIG. 2, the semiconductor package 2000 may include the first sub-package SP1 and a second sub-package SP2d. That is, the semiconductor package 2000 may include the second sub-package SP2d instead of the second sub-package SP2 of the semiconductor package 1000a illustrated in FIG. 1A.

In detail, as illustrated in FIG. 2, in the second sub-package SP2d, a plurality of semiconductor chips 220 may be connected to the second package substrate 210 by a second chip connection unit 270d instead of the second chip connection unit 270 included in the second sub-package SP2 illustrated in FIG. 1A. The second chip connection unit 270d may include a plurality of through silicon vias (TSVs) 271 and a plurality of bumps 273. The plurality of TSVs 271 may be provided in each of the plurality of semiconductor chips 220. In some embodiments, a plurality of TSVs 271 may not be provided in an uppermost second semiconductor chip 220 of the plurality of second semiconductor chips 220 which are stacked. Each of the plurality of TSVs 271 may include silicon (Si). Each of the plurality of bumps 273 may be disposed between two adjacent second semiconductor chips 220 of the plurality of second semiconductor chips 220. Each of the bumps 273 may be connected to a corresponding TSV 271. In some embodiments, a wiring layer which connects a corresponding bump 273 to a corresponding TSV 271 may be provided between each of the bumps 273 and a corresponding TSV 271. An insulation layer may be further provided between each of the bumps 273 and a corresponding TSV 271.

A second molding unit 280d may surround the second semiconductor chip 220 and may cover an upper surface of the second package substrate 210. The second molding unit 280d may cover an upper surface of the second package substrate 210 and a side surface of the second semiconductor chip 220. In some embodiments, as illustrated in FIG. 2, the second molding unit 280d may cover an upper surface of the uppermost second semiconductor chip 220 of the stacked plurality of second semiconductor chips 220. In other embodiments, unlike FIG. 2, the second molding unit 280d may not cover the upper surface of the uppermost second semiconductor chip 220 of the stacked plurality of second semiconductor chips 220. An upper surface of the second molding unit 280d and the upper surface of the uppermost second semiconductor chip 220 of the stacked plurality of second semiconductor chips 220 may be disposed on the same plane.

In some embodiments, a heat dissipation member may be attached on the upper surface of the uppermost second semiconductor chip 220 of the stacked plurality of second semiconductor chips 220. A thermal interface material (TIM) layer may be disposed between the upper surface of the uppermost second semiconductor chip 220 of the stacked plurality of second semiconductor chips 220 and the heat dissipation member.

Figure 3:
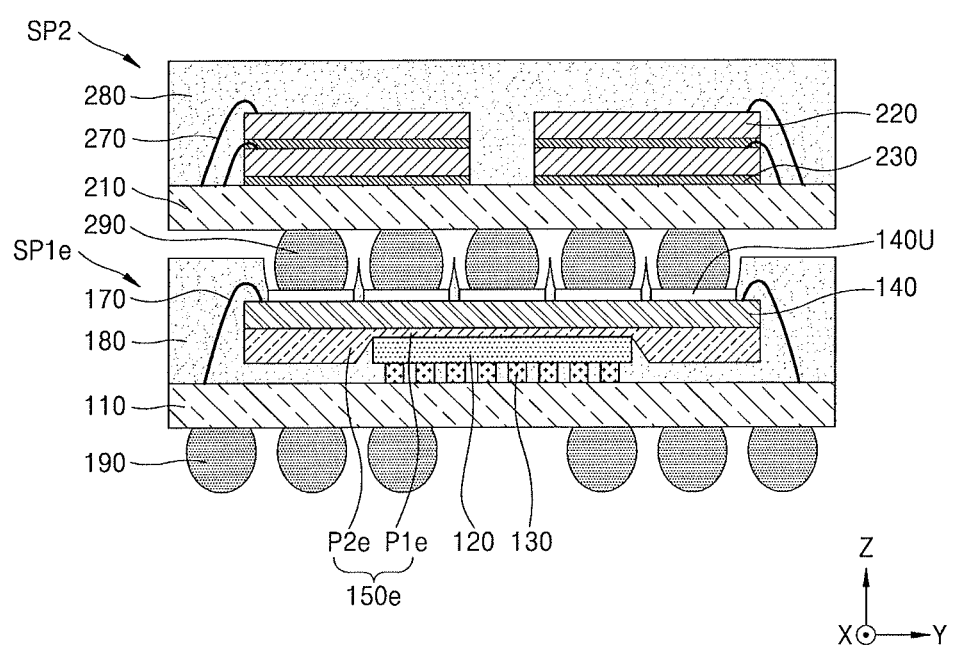
FIG. 3 illustrates a cross-sectional view of a semiconductor package according to an embodiment.

FIG. 3 is a cross-sectional view illustrating a semiconductor package 3000 according to an embodiment. Hereinafter, a difference between the semiconductor package 3000 illustrated in FIG. 3 and the semiconductor package 1000a illustrated in FIG. 1A will be described.

Referring to FIG. 3, the semiconductor package 3000 may include a first sub-package SP1e and the second sub-package SP2. That is, the semiconductor package 3000 may include the first sub-package SP1e instead of the first sub-package SP1 of the semiconductor package 1000a illustrated in FIG. 1A.

In detail, as illustrated in FIG. 3, the first sub-package SP1e may include an upper filling layer 150e instead of the upper filling layer 150a included in the first sub-package SP1 illustrated in FIG. 1A. The upper filling layer 150e may include a center portion P1e and an outer portion P2e. The outer portion P2e of the upper filling layer 150e may not cover at least a portion of a sidewall of the first semiconductor chip 120. In some embodiments, the outer portion P2e of the upper filling layer 150e may not cover the sidewall of the first semiconductor chip 120. In other embodiments, the outer portion P2e of the upper filling layer 150e may cover an upper portion of the sidewall of the first semiconductor chip 120 and may not cover a lower portion of the sidewall of the first semiconductor chip 120.

For example, as illustrated in FIG. 3, the outer portion P2e of the upper filling layer 150e may extend along a bottom of the interposer without extending along the entirety of the sidewall of the first semiconductor chip 120, e.g., a sidewall of the outer portion P2e facing the sidewall of the first semiconductor chip 120 may be inclined away from the first semiconductor chip 120. For example, the outer portion P2e of the upper filling layer 150e may include an inner wall, e.g., facing the first semiconductor chip 120, that extends farther away from the first semiconductor chip 120 in a direction closer to the first package substrate 110. That is, a distance between the inner wall and the first semiconductor chip 120 in the Y direction may increase, as a distance from the first package substrate 110 decreases. The inner wall may be inclined in a direction (e.g., in the Z direction) vertical to an upper surface of the first package substrate 110.

Figure 4:
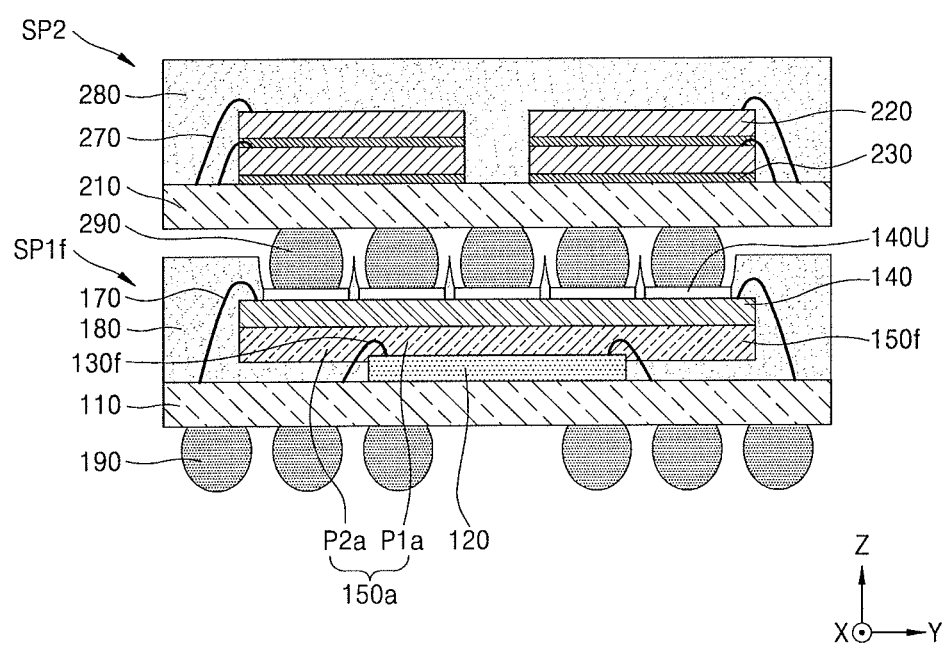
FIG. 4 illustrates a cross-sectional view of a semiconductor package according to an embodiment.

FIG. 4 is a cross-sectional view illustrating a semiconductor package 4000 according to an embodiment. Hereinafter, a difference between the semiconductor package 4000 illustrated in FIG. 4 and the semiconductor package 1000a illustrated in FIG. 1A will be described.

Referring to FIG. 4, the semiconductor package 4000 may include a first sub-package SP1f and the second sub-package SP2. That is, the semiconductor package 4000 may include the first sub-package SP1f instead of the first sub-package SP1 of the semiconductor package 1000a illustrated in FIG. 1A.

In detail, as illustrated in FIG. 4, the first sub-package SP1f may include a first chip connection unit 130f instead of the first chip connection unit 130 included in the first sub-package SP1 illustrated in FIG. 1A. The first chip connection unit 130f may connect the first semiconductor chip 120 to the first package substrate 110. The first chip connection unit 130f may be, e.g., a wire. In this case, the first chip connection unit 130f may extend between an upper surface of the first semiconductor chip 120 and an upper surface of the first package substrate 110. In some embodiments, the upper filling layer 150a may be spaced apart from the first package substrate 110 without contacting the first package substrate 110, and a portion of the first chip connection unit 103f may be disposed in the upper filling layer 150a. For example, an upper portion of the first chip connection unit 130f may be disposed in the upper filling layer 150a, and a lower portion of the first chip connection unit 130f may be disposed in the first molding unit 180. In some other embodiments, the upper filling layer 150a may contact the first package substrate 110 and may completely surround the first chip connection unit 130f.

Figure 5:
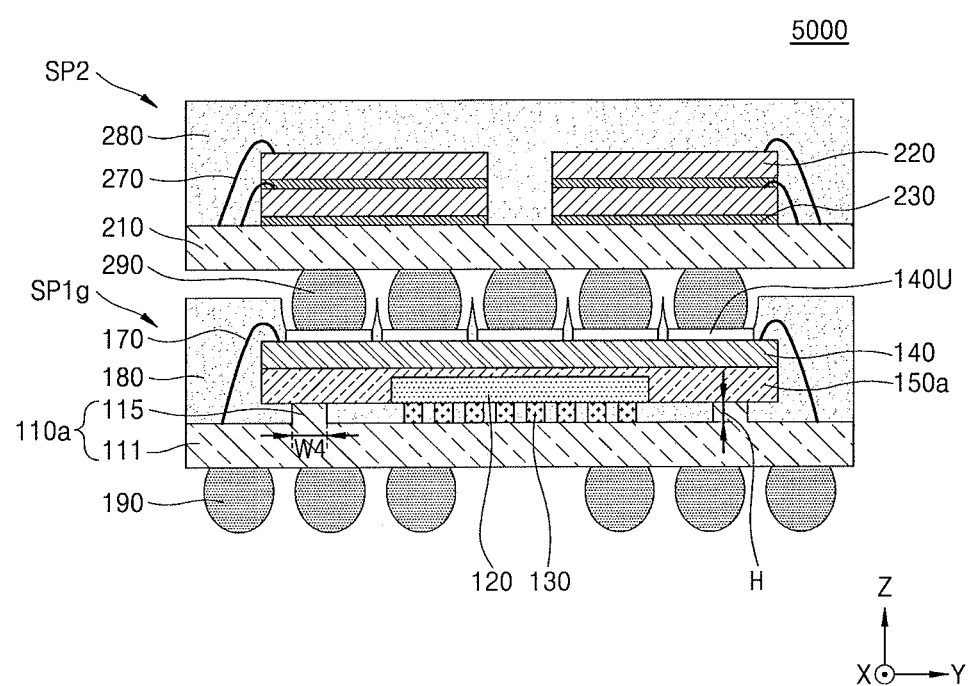
FIG. 5 illustrates a cross-sectional view of a semiconductor package according to an embodiment.

FIG. 5 is a cross-sectional view illustrating a semiconductor package 5000 according to an embodiment. Hereinafter, a difference between the semiconductor package 5000 illustrated in FIG. 5 and the semiconductor package 1000a illustrated in FIG. 1A will be described.

Referring to FIG. 5, the semiconductor package 5000 may include a first sub-package SP1g and the second sub-package SP2. That is, the semiconductor package 5000 may include the first sub-package SP1g instead of the first sub-package SP1 of the semiconductor package 1000a illustrated in FIG. 1A.

In detail, as illustrated in FIG. 5, the first sub-package SP1g may include a first package substrate 110a instead of the first package substrate 110 included in the first sub-package SP1 illustrated in FIG. 1A. The first package substrate 110a may include a base portion 111 including a flat upper surface, and a protrusion 115 which protrudes in a direction (e.g., in the Z direction) vertical to the upper surface of the base portion 111, e.g., the protrusion 115 may extend upward from the upper surface of the base portion 11 to contact the bottom of the upper filling layer 150a. The protrusion 115 may be a solder resist dam. At least a portion of the protrusion 115 may include a portion of a solder resist layer of the first package substrate 110a. The protrusion 115 may have a fourth width W4 in a direction (e.g., in the X direction) parallel to an upper surface of the first package substrate 110a. The protrusion 115 may have a height H in the direction (e.g., in the Z direction) vertical to the upper surface of the first package substrate 110a from the upper surface of the base portion 111. In some embodiments, the fourth width W4 of the protrusion 115 may be greater than the height H of the protrusion 115. When the fourth width W4 of the protrusion 115 is greater than the height H of the protrusion 115, an area of the upper filling layer 150a supported by the protrusion 115 may be widened, and thus, the deflection of the overhung portion of the interposer 140 supported by the upper filling layer 150a may be effectively prevented.

The upper filling layer 150a may contact the protrusion 115 of the first package substrate 110a. In detail, the outer portion P2a of the upper filling layer 150a may contact the protrusion 115 of the first package substrate 110a. That is, the upper filling layer 150a may be supported by the protrusion 115 of the first package substrate 110a. Therefore, a portion of the interposer 140 overhanging the first semiconductor chip 120 may be supported by the outer portion P2a of the upper filling layer 150a and the protrusion 115, and thus, deflection of the portion of the interposer 140 overhanging the first semiconductor chip 120 may be prevented.

Figure 6A:
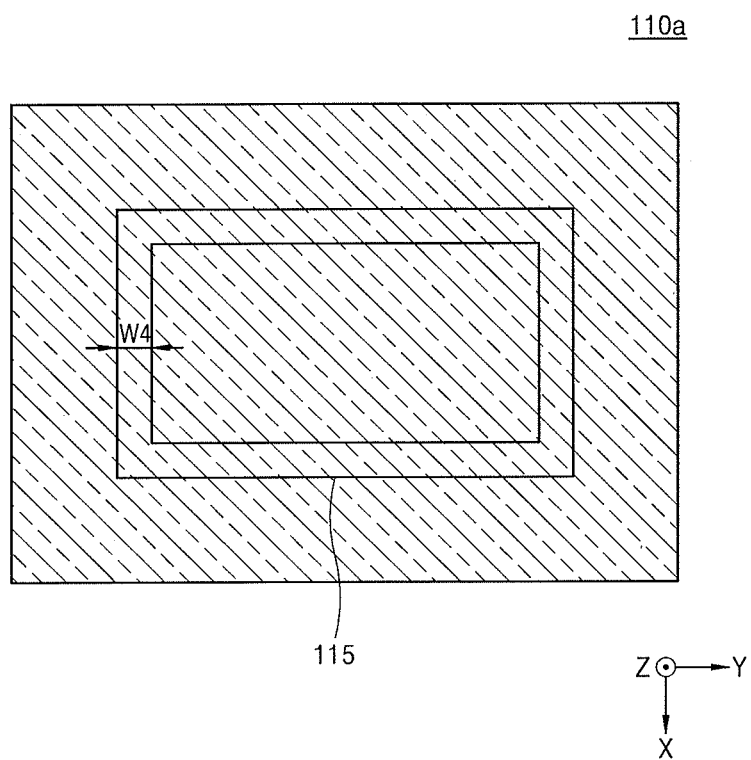
FIG. 6A illustrates a plan view of a first package substrate included in a semiconductor package according to an embodiment.

FIG. 6A is a plan view of the first package substrate 110a included in a semiconductor package according to an embodiment. Referring to FIG. 6A, the first package substrate 110a may include the protrusion 115. As seen from above, the protrusion 115 of the first package substrate 110a may form a closed-loop shape to have a certain, e.g., constant, width W4. In some embodiments, as seen from above, the first package substrate 110a may include a tetragonal upper surface, and the protrusion 115 may have a tetragonal loop shape.

Figure 6B:
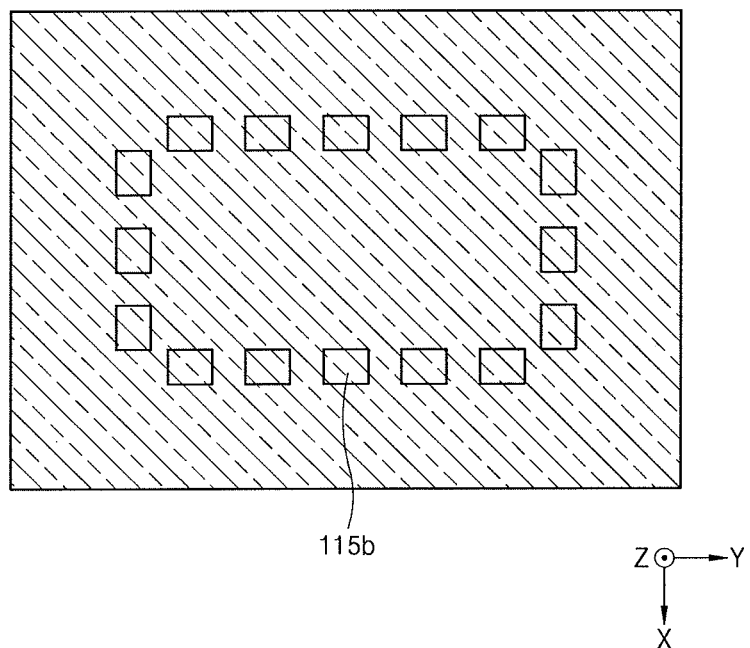
FIG. 6B illustrates a plan view of a first package substrate included in a semiconductor package according to an embodiment.

FIG. 6B is a plan view of a first package substrate 110b included in a semiconductor package according to an embodiment. The semiconductor package 5000 illustrated in FIG. 5 may include the first package substrate 110b illustrated in FIG. 6B instead of the first package substrate 110a illustrated in FIG. 6A.

Referring to FIG. 6B, the first package substrate 110b may include a plurality of protrusions 115b. The plurality of protrusions 115b may be disposed along a cut loop and may be spaced apart from one another. Each of the plurality of protrusions 115b may approximately have a rectangular parallelepiped shape, but is not limited thereto.

Figure 6C:
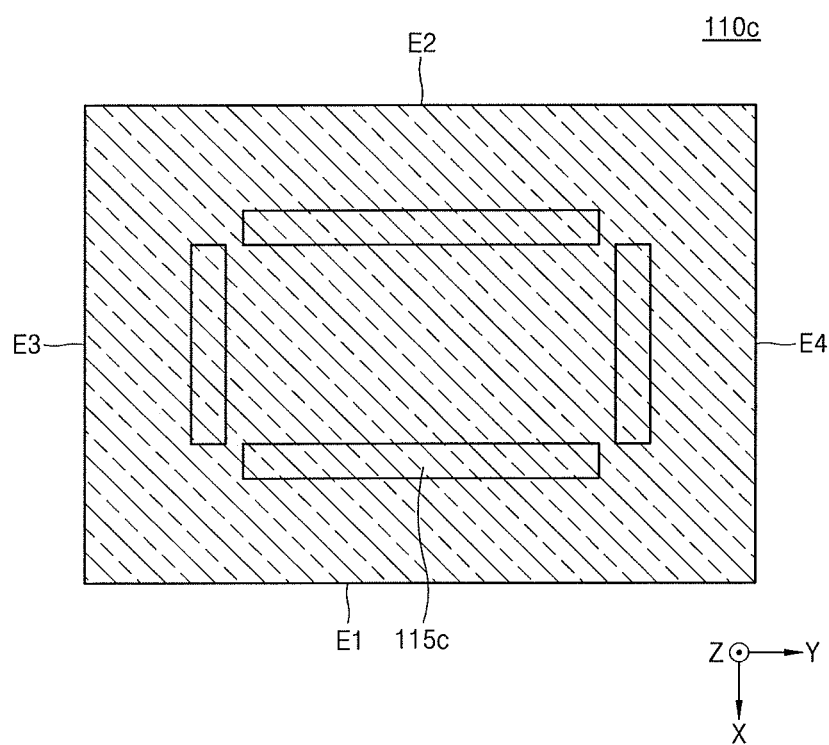
FIG. 6C illustrates a plan view of a first package substrate included in a semiconductor package according to an embodiment.

FIG. 6C is a plan view of a first package substrate 110c included in a semiconductor package according to an embodiment. The semiconductor package 5000 illustrated in FIG. 5 may include the first package substrate 110c illustrated in FIG. 6C instead of the first package substrate 110a illustrated in FIG. 6A.

Referring to FIG. 6C, the first package substrate 110c may include a plurality of protrusions 115b. The plurality of protrusions 115b may be spaced apart from one another. Each of the plurality of protrusions 115b may be adjacent to a corresponding edge of edges of an upper surface of the first package substrate 110c and may extend in a direction parallel to the corresponding edge. For example, the upper surface of the first package substrate 110c may include first and second edges E1 and E2, which extend in a Y direction and are opposite to each other, and third and fourth edges E3 and E4 which extend in an X direction and are opposite to each other. One of the plurality of protrusions 115b may extend in the Y direction and may be closer to the first edge E1 than the second edge E2. Another protrusion of the plurality of protrusions 115b may extend in the Y direction and may be closer to the second edge E2 than the first edge E1. Another protrusion of the plurality of protrusions 115b may extend in the X direction and may be closer to the third edge E3 than the fourth edge E4. Another protrusion of the plurality of protrusions 115b may extend in the X direction and may be closer to the fourth edge E4 than the third edge E3. For example, as illustrated in FIG. 6C, the plurality of protrusions 115b may be four protrusions spaced apart from each other and arranged into a rectangular shape (in top view), but embodiments are not limited thereto.

Figure 7:
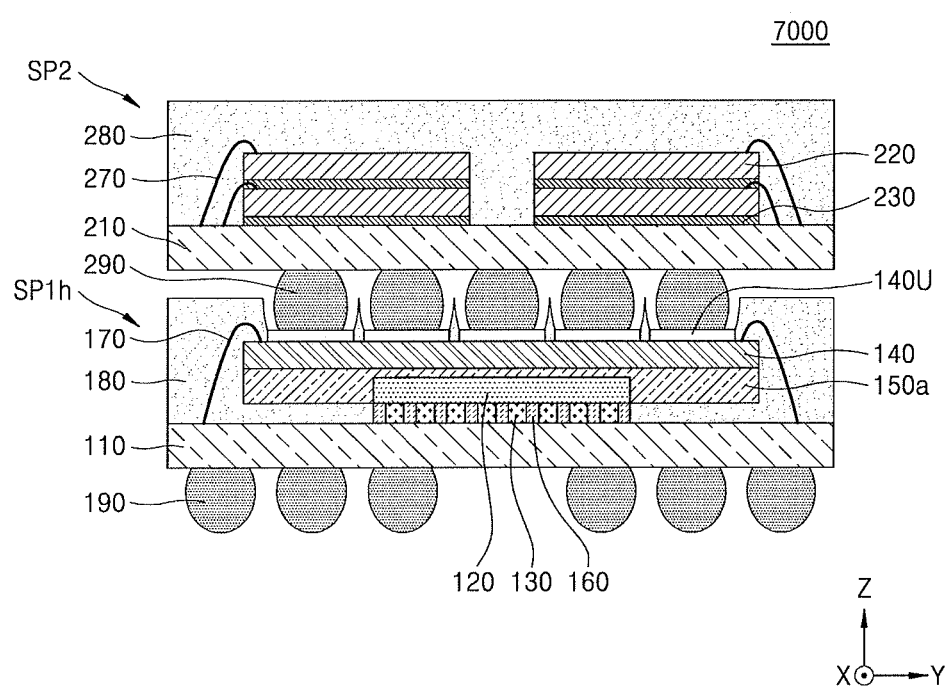
FIG. 7 illustrates a cross-sectional view of a semiconductor package according to an embodiment.

FIG. 7 is a cross-sectional view illustrating a semiconductor package 7000 according to an embodiment. Hereinafter, a difference between the semiconductor package 7000 illustrated in FIG. 7 and the semiconductor package 1000a illustrated in FIG. 1A will be described.

Referring to FIG. 7, the semiconductor package 7000 may include a first sub-package SP1N and the second sub-package SP2. That is, the semiconductor package 7000 may include the first sub-package SP instead of the first sub-package SP1 of the semiconductor package 1000a illustrated in FIG. 1A.

In detail, as illustrated in FIG. 7, the first sub-package SP1h, unlike the first sub-package SP1 illustrated in FIG. 1A, may further include a lower filling layer 160. The lower filling layer 160 may be disposed between the first semiconductor chip 120 and the first package substrate 110 and may surround the plurality of first chip connection units 130. The lower filling layer 160 may include, e.g., a DAF, an underfill, an NCF, or an NCP. The lower filling layer 160 may include, e.g., an epoxy-based organic material.

Figure 8:
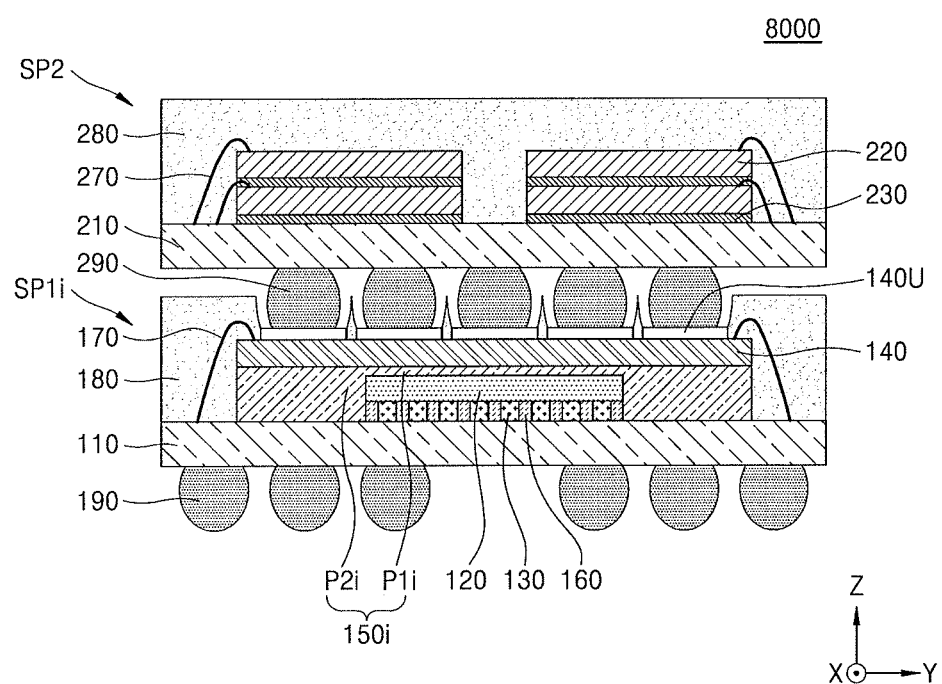
FIG. 8 illustrates a cross-sectional view of a semiconductor package according to an embodiment.

FIG. 8 is a cross-sectional view illustrating a semiconductor package 8000 according to an embodiment. Hereinafter, a difference between the semiconductor package 8000 illustrated in FIG. 8 and the semiconductor package 7000 illustrated in FIG. 7 will be described.

Referring to FIG. 8, the semiconductor package 8000 may include a first sub-package SP1i and the second sub-package SP2. That is, the semiconductor package 8000 may include the first sub-package SP1i instead of the first sub-package SPh of the semiconductor package 7000 illustrated in FIG. 7.

In detail, as illustrated in FIG. 8, the first sub-package SP1i may include an upper filling layer 150i instead of the upper filling layer 150a included in the first sub-package SP illustrated in FIG. 7. The upper filling layer 150i may include an outer portion P2i and a center portion P1i. The center portion P1i of the upper filling layer 150i may be disposed between the first semiconductor chip 120 and the interposer 140. The outer portion P2i of the upper filling layer 150i may surround the center portion P1i and may contact a lower surface of the interposer 140, the lower filling layer 160, a sidewall of the first semiconductor chip 120, and the first package substrate 110.

Since the outer portion P2i of the upper filling layer 150i contacts the first package substrate 110, the outer portion P2i of the upper filling layer 150i may be supported by the first package substrate 110. Therefore, a portion of the interposer 140 overhanging the first semiconductor chip 120 may be supported by the first package substrate 110 and the outer portion P2i of the upper filling layer 150i. Accordingly, deflection of the overhung portion of the interposer 140 may be prevented or substantially minimized.

Figure 9:
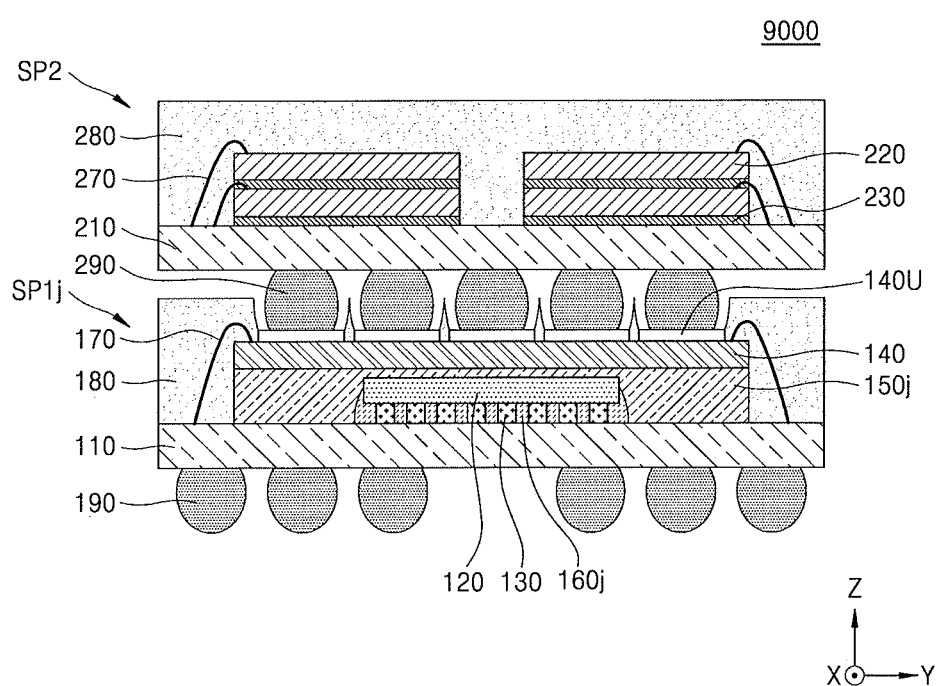
FIG. 9 illustrates a cross-sectional view of a semiconductor package according to an embodiment.

FIG. 9 is a cross-sectional view illustrating a semiconductor package 9000 according to an embodiment. Hereinafter, a difference between the semiconductor package 9000 illustrated in FIG. 9 and the semiconductor package 8000 illustrated in FIG. 8 will be described.

Referring to FIG. 9, the semiconductor package 9000 may include a first sub-package SP1j and the second sub-package SP2. That is, the semiconductor package 9000 may include the first sub-package SP1j instead of the first sub-package SP1i of the semiconductor package 8000 illustrated in FIG. 8.

In detail, as illustrated in FIG. 9, the first sub-package SP1j may include a lower filling layer 160j instead of the lower filling layer 160 included in the first sub-package SP1i illustrated in FIG. 8. The lower filling layer 160j may contact at least a portion of a sidewall of the first semiconductor chip 120. For example, the lower filling layer 160j may contact a lower portion of the sidewall of the first semiconductor chip 120. In some embodiments, a sidewall of the lower filling layer 160*j* may convexly protrude in a direction from a space between a first package substrate 110 and the first semiconductor chip 120 to the outside.

Figure 10:
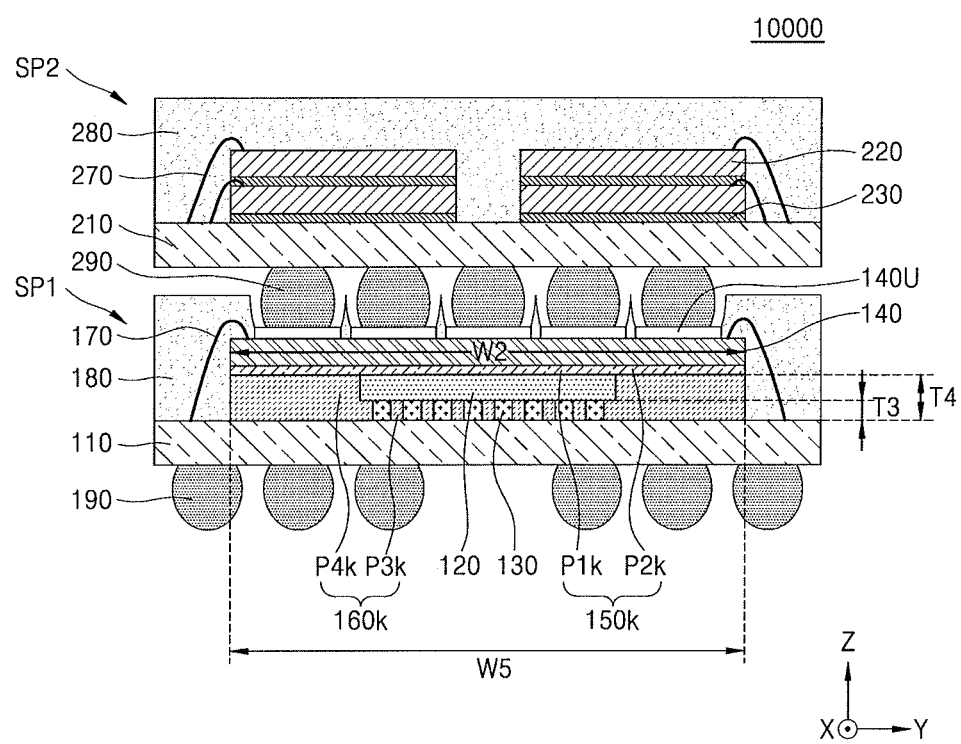
FIG. 10 illustrates a cross-sectional view of a semiconductor package according to an embodiment.

FIG. 10 is a cross-sectional view illustrating a semiconductor package 10000 according to an embodiment. Hereinafter, a difference between the semiconductor package 10000 illustrated in FIG. 10 and the semiconductor package 8000 illustrated in FIG. 8 will be described.

Referring to FIG. 10, the semiconductor package 10000 may include a first sub-package SP1*k* and the second sub-package SP2. That is, the semiconductor package 10000 may include the first sub-package SP1*k* instead of the first sub-package SP1*i* of the semiconductor package 8000 illustrated in FIG. 8.

In detail, as illustrated in FIG. 10, the first sub-package SP1*k* may include a lower filling layer 160*k* and an upper filling layer 150*k* instead of the lower filling layer 160 and the upper filling layer 150*i* included in the first sub-package SP1*i* in FIG. 8. The lower filling layer 160*k* may include a center portion P3*k* and an outer portion P4*k*. The center portion P3*k* of the lower filling layer 160*k* may be disposed between the first semiconductor chip 120 and the first package substrate 110. The outer portion P4*k* of the lower filling layer 160*k* may surround the center portion P3*k* and may contact an upper surface of the first package substrate 110 and a sidewall of the first semiconductor chip 120. The outer portion P4*k* of the lower filling layer 160*k* may cover the whole sidewall of the first semiconductor chip 120. An upper surface of the outer portion P4*k* of the lower filling layer 160*k* and an upper surface of the first semiconductor chip 120 may be coplanar.

The lower filling layer 160*k* may have a fifth width W5 in a direction (e.g., in the Y direction) parallel to the upper surface of the first package substrate 110. In some embodiments, the fifth width W5 of the lower filling layer 160*k* may be the same as a second width W2 of an interposer 140. In some other embodiments, the fifth width W5 of the lower filling layer 160*k* may be greater than the second width W2 of the interposer 140. In some other embodiments, the fifth width W5 of the lower filling layer 160*k* may be less than the second width W2 of the interposer 140.

The center portion P3*k* of the lower filling layer 160*k* may have a third thickness T3 in a direction (e.g., in the Z direction) vertical to the upper surface of the first package substrate 110, and the outer portion P4*k* of the lower filling layer 160*k* may have a fourth thickness T4 in the direction (e.g., in the Z direction) vertical to the upper surface of the first package substrate 110. The third thickness T3 of the center portion P3*k* of the lower filling layer 160*k* may be less than a fourth thickness T4 of the outer portion P4*k* of the lower filling layer 160*k*.

The upper filling layer 150*k* may not cover the sidewall of the first semiconductor chip 120. The upper filling layer 150*k* may include a center portion P1*k* and an outer portion P2*k*. The center portion P1*k* of the upper filling layer 150*k* may be disposed between the first semiconductor chip 120 and the interposer 140. The outer portion P2*k* of the upper filling layer 150*k* may surround the center portion P1*k* of the upper filling layer 150*k* and may contact a lower surface of the interposer 140 and the lower filling layer 160*k*. The upper filling layer 150*k* may include a flat lower surface. The outer portion P2*k* of the upper filling layer 150*k* and the center portion P1*k* of the upper filling layer 150*k* may have the same thickness in the direction (e.g., in the Z direction) vertical to the upper surface of the first package substrate 110.

In the semiconductor package 10000 according to an embodiment, a portion of the interposer 140 overhanging the first semiconductor chip 120 may be supported by the upper filling layer 150*k* and the lower filling layer 160*k*. Accordingly, deflection of the overhung portion of the interposer 140 may be prevented.

Figure 11:
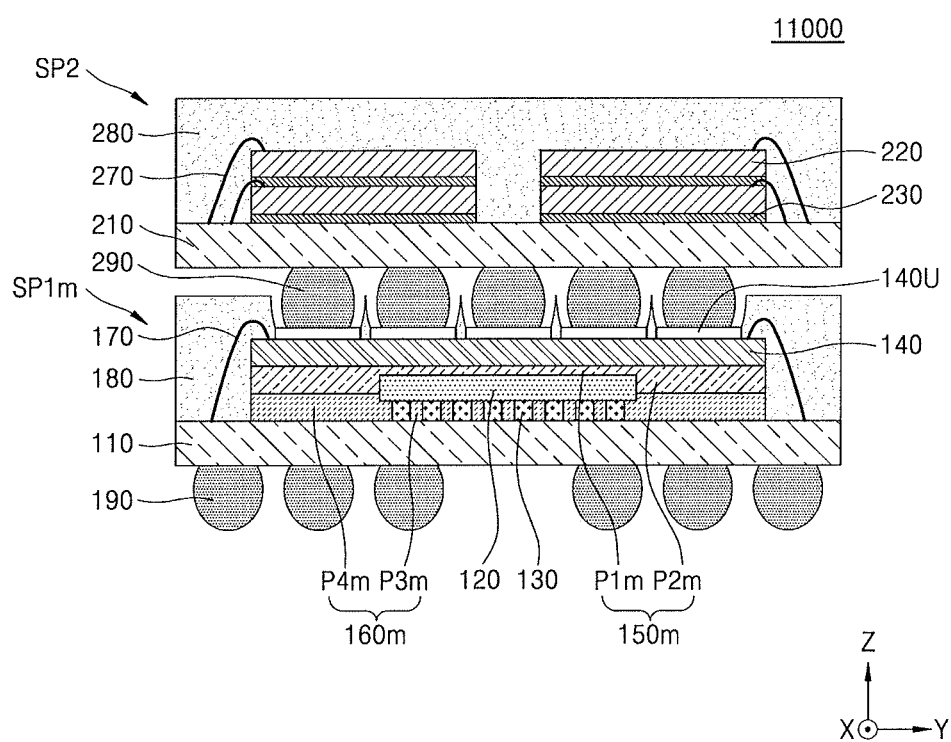
FIG. 11 illustrates a cross-sectional view of a semiconductor package according to an embodiment.

FIG. 11 is a cross-sectional view illustrating a semiconductor package 11000 according to an embodiment. Hereinafter, a difference between the semiconductor package 11000 illustrated in FIG. 11 and the semiconductor package 10000 illustrated in FIG. 10 will be described.

Referring to FIG. 11, the semiconductor package 11000 may include a first sub-package SP1*m* and the second sub-package SP2. That is, the semiconductor package 11000 may include the first sub-package SP1*m* instead of the first sub-package SP1*k* of the semiconductor package 10000 illustrated in FIG. 10.

In detail, as illustrated in FIG. 11, the first sub-package SP1*m* may include an upper filling layer 150*m* and a lower filling layer 160*m* instead of the upper filling layer 150*k* and the lower filling layer 160*k*, respectively, included in the first sub-package SP1*k* illustrated in FIG. 10. The upper filling layer 150*m* may include a center portion P1*m* and an outer portion P2*m*. The outer portion P2*m* of the upper filling layer 150*m* may contact a portion of a sidewall of a first semiconductor chip 120. The lower filling layer 160*m* may include a center portion P3*m* and an outer portion P4*m*. The outer portion P4*m* of the lower filling layer 160*m* may contact another portion of the sidewall of the first semiconductor chip 120. A lower surface of the upper filling layer 150*m* may contact an upper surface of the lower filling layer 160*m*. A boundary surface between the lower surface of the upper filling layer 150*m* and the upper surface of the lower filling layer 160*m* may be disposed in a level which is lower in position than an upper surface of the first semiconductor chip 120 and is higher in position than a lower surface of the first semiconductor chip 120.

FIGS. 12A to 12D are cross-sectional views describing stages in a method of manufacturing a semiconductor package according to an embodiment. Hereinafter, a method of manufacturing each of the semiconductor packages respectively illustrated in FIGS. 1A to 3 will be described.

Figure 12A:
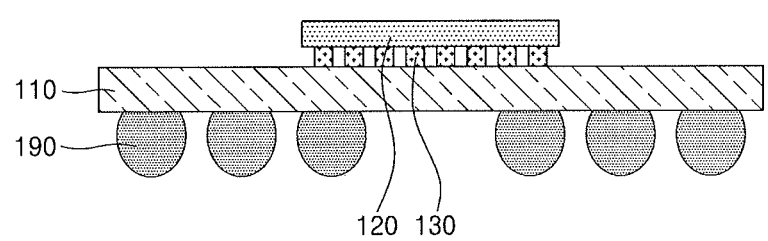
FIGS. 12A to 12D illustrate cross-sectional views of stages in a method of manufacturing a semiconductor package according to an embodiment.

Referring to FIG. 12A, the first semiconductor chip 120 with the plurality of first chip connection units 130 attached thereon may be attached on the first package substrate 110 in order for the plurality of first chip connection units 130 to face the first package substrate 110. The plurality of first chip connection units 130 may connect the first semiconductor chip 120 to the first package substrate 110.

In FIG. 12A, it is illustrated that the external connection unit 190 is attached on a lower surface of the first package substrate 110 before the first semiconductor chip 120 is attached on the first package substrate 110, but the present embodiment is not limited thereto. In some embodiments, as illustrated in FIG. 12D, the second sub-package SP2 may be attached on the first sub-package SP1, and then, the external connection unit 190 may be attached on the lower surface of the first package substrate 110.

Figure 12B:
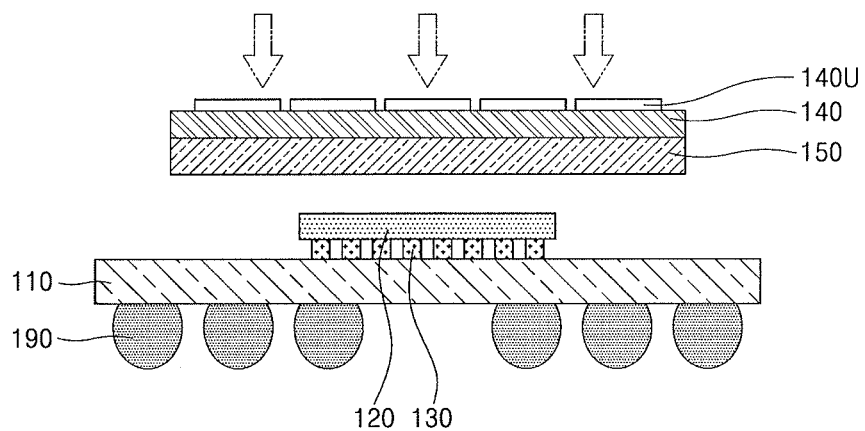

Referring to FIG. 12B, the upper filling layer 150*a* may be attached on a lower surface of the interposer 140. Subsequently, the interposer 140 with the upper filling layer 150*a* attached thereon may be attached on the first semiconductor chip 120 in order for the upper filling layer 150*a* to face the first semiconductor chip 120. That is, the interposer 140 with the upper filling layer 150a may be arranged over the first semiconductor chip 120, such that the upper filling layer 150a may face the top of the first semiconductor chip 120. Pressure may be applied to the interposer 140 while the interposer 140 is being attached on the first semiconductor chip 120 (in a downward direction along arrows in FIG. 12B). When the pressure is applied to the interposer 140, the upper filling layer 150a may be deformed based on a shape of the first semiconductor chip 120, e.g., portions of the upper filling layer 150a overhanging the semiconductor chip 120 may be pushed toward the first package substrate 110 along sidewalls of the first semiconductor chip 120. In other words, the lower surface of the upper filling layer 150a may move more downward than, e.g., beyond, an upper surface of the first semiconductor chip 120. The pressure may be applied to the interposer 140 until a height from an upper surface of the first package substrate 110 to the lower surface of the upper filling layer 150a becomes equal to a height from the upper surface of the first package substrate 110 to the lower surface of the first semiconductor chip 120.

Figure 12C:
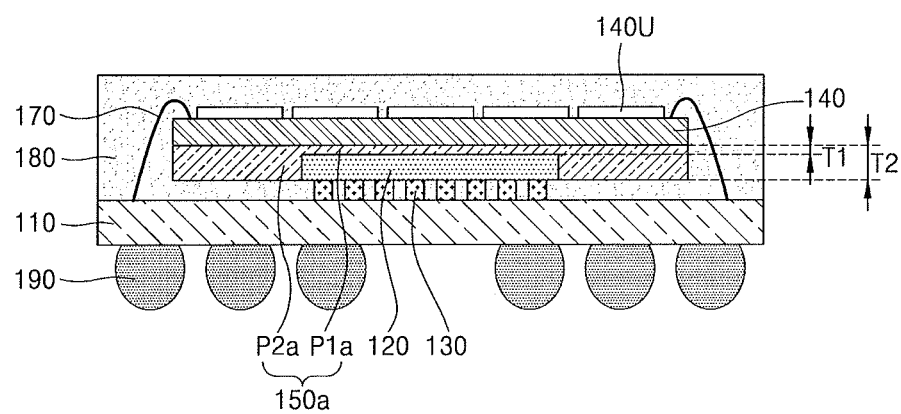
Figure 12D:
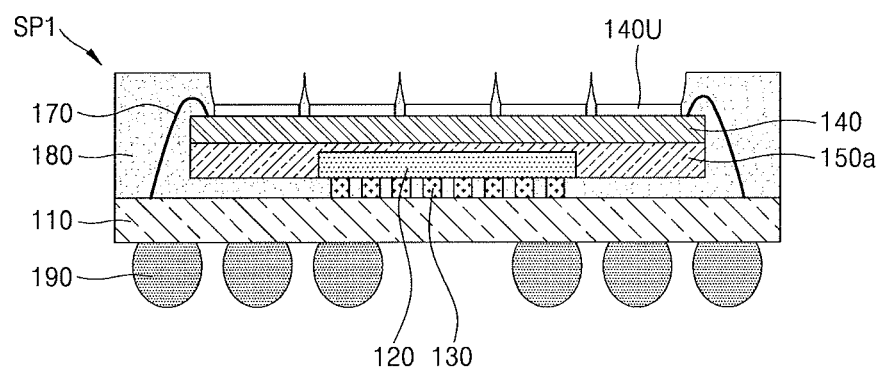

Accordingly, as in FIG. 12C, the thickness T2 of the outer portion P2 of the upper filling layer 150a may be greater than the thickness T1 of the center portion P1 of the upper filling layer 150a. As further illustrated in FIG. 12C, the interposer 140 may be connected to the first package substrate 110 by using the plurality of wires 170. For example, the plurality of wires 170 may be formed to extend from the upper surface of the interposer 140 to the upper surface of the first package substrate 110.

Subsequently, the first molding unit 180 may be formed on the first package substrate 110. The first molding unit 180 may be formed to surround the first semiconductor chip 120, the plurality of first chip connection units 130, the plurality of wires 170, the upper filling layer 150a, and the interposer 140, and to cover the upper surface of the first package substrate 110.

Referring to FIG. 12D, a plurality of openings which expose the plurality of connection pads 140U of the interposer 140 may be formed in the first molding unit 180, and thus, the first sub-package SP1 may be formed. For example, the plurality of openings may be formed through a drill process using a laser.

The second sub-package SP2 illustrated in FIG. 1A may be prepared independently of the first sub-package SP1. To describe a process of preparing the second sub-package SP2, at least one second semiconductor chip 220 may be attached on the second package substrate 210 by using the adhesive layer 230, the second package substrate 210 may be connected to the second semiconductor chip 220 by the plurality of second chip connection units 270, the second molding unit 280 which surrounds the plurality of second chip connection units 270 and the second semiconductor chip 220 and covers an upper surface of the second package substrate 210 may be formed, and the plurality of inter-package connection units 290 may be attached on a lower surface of the second package substrate 210, thereby preparing the second sub-package SP2.

Subsequently, the second sub-package SP2 may be attached on the first sub-package SP1 in order for the plurality of inter-package connection units 290 to respectively contact the plurality of connection pads 140U of the interposer 140 through the plurality of openings of the first molding unit 180, Thus, the semiconductor package 1000a may be finished.

In some embodiments, a plurality of lower inter-package connection units respectively connected to the plurality of connection pads 140U of the interposer 140 may be respectively disposed in the plurality of openings which respectively expose the plurality of the connection pads 140U of the interposer 140. A plurality of upper inter-package connection units may be attached on a lower surface of the second package substrate 210 subsequently, and the plurality of lower inter-package connection units may be respectively connected to the plurality of upper inter-package connection units subsequently, thereby forming the plurality of inter-package connection units 290.

In order to manufacture the semiconductor package 1000b illustrated in FIG. 1B, as in FIG. 12A, the first semiconductor chip 120 may be attached on the first package substrate 110. Subsequently, referring to FIG. 1B, the upper filling layer 150b may be attached on the lower surface of the interposer 140. The interposer 140 with the upper filling layer 150b attached thereon may be placed on the first semiconductor chip 120. Subsequently, pressure may be applied to the interposer 140 until a height from the upper surface of the first package substrate 110 to the lower surface of the upper filling layer 150b is more than a height from the upper surface of the first package substrate 110 to the lower surface of the first semiconductor chip 120. Processes subsequent thereto are the same as the method of manufacturing the semiconductor package 1000a illustrated in FIG. 1A, and thus, its detailed description is omitted.

In order to manufacture the semiconductor package 1000c illustrated in FIG. 1C, as in FIG. 12A, the first semiconductor chip 120 may be attached on the first package substrate 110. Subsequently, referring to FIG. 1C, the upper filling layer 150c may be attached on the lower surface of the interposer 140. The interposer 140 with the upper filling layer 150c attached thereon may be placed on the first semiconductor chip 120. Subsequently, pressure may be applied to the interposer 140 until a height from the upper surface of the first package substrate 110 to the lower surface of the upper filling layer 150c becomes less than a height from the upper surface of the first package substrate 110 to the lower surface of the first semiconductor chip 120. Processes subsequent thereto are the same as the method of manufacturing the semiconductor package 1000c illustrated in FIG. 1C, and thus, its detailed description is omitted.

In order to manufacture the semiconductor package 2000 illustrated in FIG. 2, the first sub-package SP1 may be prepared by performing processes described above with reference to FIGS. 12A to 12D. Subsequently, the second sub-package SP2d illustrated in FIG. 2 may be prepared. A process of preparing the second sub-package SP2d may include a process of preparing a stacked structure where the second semiconductor chips 220 connected to one another through the TSVs 271 and the bumps 273 are stacked, a process of placing the stacked structure on the second package substrate 210, and a process of forming the second molding unit 280. Subsequently, by coupling the second sub-package SP2d to the first sub-package SP1, the second semiconductor package 2000 illustrated in FIG. 2 may be finished.

In order to manufacture the semiconductor package 3000 illustrated in FIG. 3, as in FIG. 12A, the first semiconductor chip 120 may be attached on the first package substrate 110. Subsequently, as illustrated in FIG. 3, the upper filling layer 150e may be attached on the lower surface of the interposer 140. The interposer 140 with the upper filling layer 150e attached thereon may be placed on the first semiconductor chip 120. Subsequently, the lower surface of the upper filling layer 150e may move downward, and in this case, heat and/or pressure may be applied to the interposer 140 in order for the upper filling layer 150e not to cover at least a portion of the sidewall of the first semiconductor chip 120. Processes subsequent thereto are the same as the method of manufacturing the semiconductor package 1000a illustrated in FIG. 1A, and thus, its detailed description is omitted.

Figure 13:
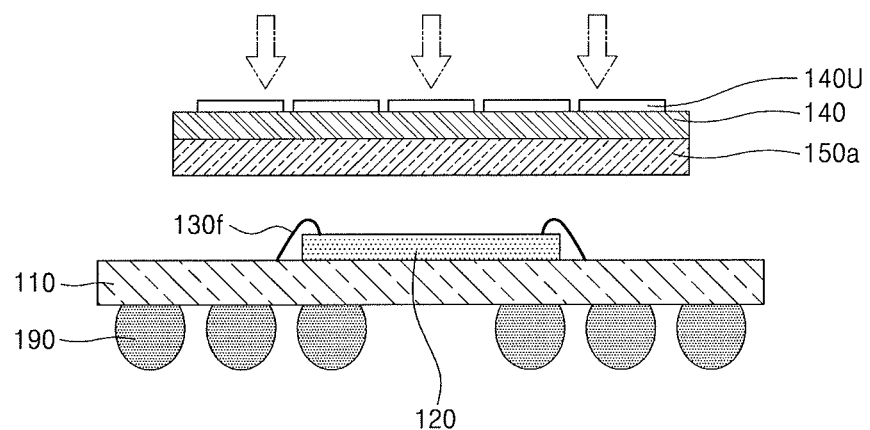
FIG. 13 illustrates a cross-sectional view of a method of manufacturing a semiconductor package according to an embodiment.

FIG. 13 is a diagram for describing a method of manufacturing a semiconductor package according to an embodiment. Hereinafter, a method of manufacturing the semiconductor package 4000 illustrated in FIG. 4 will be described.

Referring to FIG. 13, the first semiconductor chip 120 may be attached on the first package substrate 110. Subsequently, the first semiconductor chip 120 may be connected to the first package substrate 110 by the first chip connection unit 130f. For example, the first chip connection unit 130f may be formed to extend from the upper surface of the first semiconductor chip 120 to the upper surface of the first package substrate 110.

Subsequently, the upper filling layer 150a may be attached on the lower surface of the interposer 140. Subsequently, the interposer 140 with the upper filling layer 150a attached thereon may be placed on the first semiconductor chip 120, and pressure may be applied to the interposer 140. Therefore, the upper filling layer 150a may surround a portion of the first chip connection unit 130f. In some embodiments, the upper filling layer 150a and the first package substrate 110 may be spaced apart from each other without contact therebetween. In some other embodiments, the upper filling layer 150a may contact the first package substrate 110 and may wholly surround the first chip connection unit 130f. Processes subsequent thereto are the same as the method of manufacturing the semiconductor package 1000a illustrated in FIG. 1A, and thus, their detailed descriptions are omitted.

Figure 14:
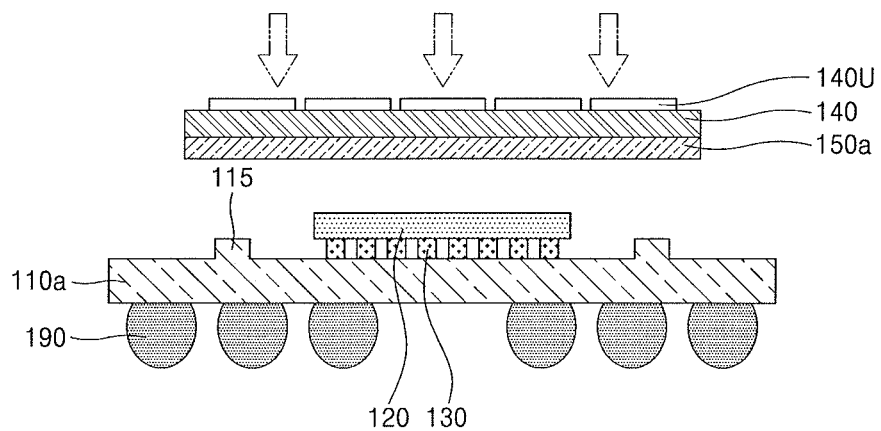
FIG. 14 illustrates a cross-sectional view of a method of manufacturing a semiconductor package according to an embodiment.

FIG. 14 is a diagram for describing a method of manufacturing a semiconductor package according to an embodiment. Hereinafter, a method of manufacturing the semiconductor package 5000 illustrated in FIG. 5 will be described.

Referring to FIG. 14, the first package substrate 110a including the protrusion 115 may be provided. The upper filling layer 150a may be attached on the lower surface of the interposer 140. Subsequently, the interposer 140 with the upper filling layer 150a attached thereon may be placed on the first semiconductor chip 120, and pressure may be applied to the interposer 140 in order for the upper filling layer 150a to contact the protrusion 115. Processes subsequent thereto are the same as the method of manufacturing the semiconductor package 1000a illustrated in FIG. 1A, and thus, their detailed descriptions are omitted.

Figure 15:
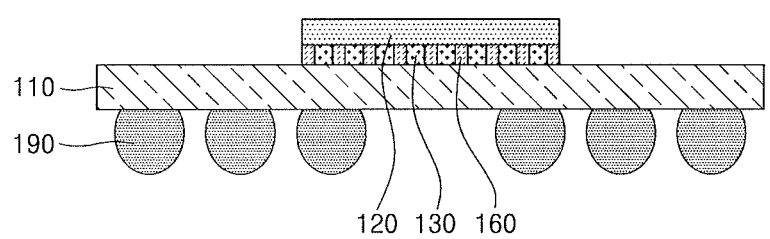
FIG. 15 illustrates a cross-sectional view of a method of manufacturing a semiconductor package according to an embodiment.

FIG. 15 is a diagram for describing a method of manufacturing a semiconductor package according to an embodiment. Hereinafter, a method of manufacturing the semiconductor package 7000 illustrated in FIG. 7 will be described.

Referring to FIG. 15, the first semiconductor chip 120 may be attached on the first package substrate 110. The lower filling layer 160 surrounding the plurality of first chip connection units 130 may be filled into a space between the first package substrate 110 and the first semiconductor chip 120. In some embodiments, the lower filling layer 160 may be attached on the lower surface of the first semiconductor chip 120, the first semiconductor chip 120 may be placed on the first package substrate 110 in order for the lower filling layer 160 to face the first package substrate 110, and pressure may be applied to the first semiconductor chip 120. In some other embodiments, the first semiconductor chip 120 may be attached on the first package substrate 110, and then, the lower filling layer 160 filling the space between the first package substrate 110 and the first semiconductor chip 120 may be formed. Processes subsequent thereto are the same as the method of manufacturing the semiconductor package 1000a illustrated in FIG. 1A, and thus, their detailed descriptions are omitted.

Figure 16A:
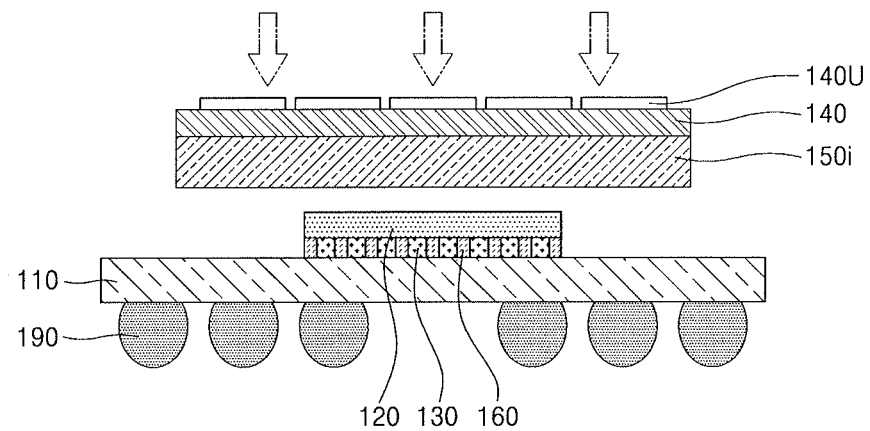
FIGS. 16A and 16B illustrate cross-sectional views of stages in a method of manufacturing a semiconductor package according to an embodiment.
Figure 16B:
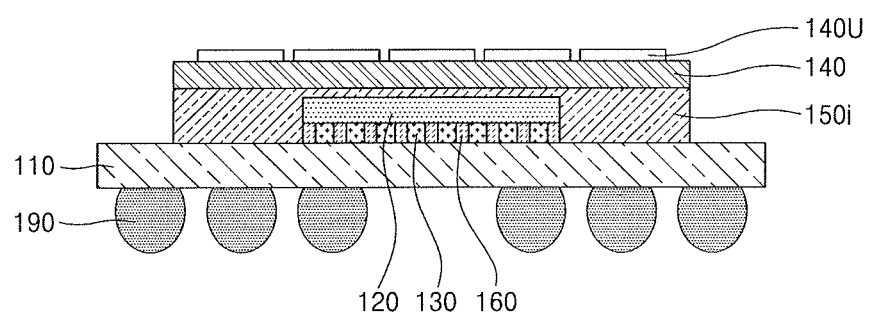

FIGS. 16A and 16B are diagrams for describing a method of manufacturing a semiconductor package according to an embodiment. Hereinafter, a method of manufacturing the semiconductor package 8000 illustrated in FIG. 8 will be described.

Referring to FIG. 16A, as described above with reference to FIG. 15, the first semiconductor chip 120 may be attached on the first package substrate 110 in order for the lower filling layer 160 to fill a space between the first package substrate 110 and the first semiconductor chip 120. The upper filling layer 150i may be formed or attached on the lower surface of the interposer 140. Subsequently, the interposer 140 with the upper filling layer 150i attached thereon may be placed on the first semiconductor chip 120 in order for the upper filling layer 150i to face the first semiconductor chip 120. Subsequently, pressure and heat may be applied to the interposer 140.

Therefore, as illustrated in FIG. 16B, the upper filling layer 150i may be deformed, and thus, the upper surface of the first package substrate 110 may contact the sidewall of the first semiconductor chip 120. In some embodiments, the upper filling layer 150i may contact a side surface of the lower filling layer 160. Processes subsequent thereto are the same as the method of manufacturing the semiconductor package 1000a illustrated in FIG. 1A, and thus, their detailed descriptions are omitted.

Figure 17:
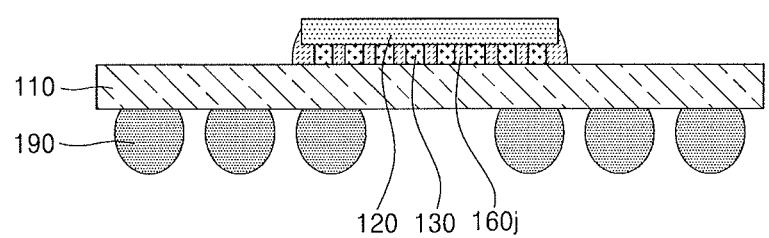
FIG. 17 illustrates a cross-sectional view of a method of manufacturing a semiconductor package according to an embodiment.

FIG. 17 is a diagram for describing a method of manufacturing a semiconductor package according to an embodiment. Hereinafter, a method of manufacturing the semiconductor package 9000 illustrated in FIG. 9 will be described.

Referring to FIG. 17, the first semiconductor chip 120 may be attached on the first package substrate 110. The lower filling layer 160 surrounding the plurality of first chip connection units 130 may be filled in a space between the first package substrate 110 and the first semiconductor chip 120. At this time, the lower filling layer 160j may be formed to cover at least a portion of the sidewall of the first semiconductor chip 120. In some embodiments, for example, the lower filling layer 160j may be attached on the lower surface of the first semiconductor chip 120, and then, the first semiconductor chip 120 may be placed on the first package substrate 110 in order for the lower filling layer 160j to face the first package substrate 110. Subsequently, by applying pressure to the first semiconductor chip 120, the plurality of first chip connection units 130 may be connected to the first package substrate 110. In such a process, a portion of the lower filling layer 160j may overflow from the space between the first package substrate 110 and the first semiconductor chip 120 to the outside and may convexly protrude. In some embodiments, the lower filling layer 160j may overflow from the space between the first package substrate 110 and the first semiconductor chip 120 to the outside and may contact at least a portion of the sidewall of the first semiconductor chip 120. In some other embodiments, the first semiconductor chip 120 may be attached on the first package substrate 110, and then, the lower filling layer 160j may be formed to fill the space between the first package substrate 110 and the first semiconductor chip 120 and to contact the sidewall of the first semiconductor chip 120. Processes subsequent thereto are the same as the method of manufacturing the semiconductor package 5000 illustrated in FIG. 5, and thus, their detailed descriptions are omitted.

Figure 18A:
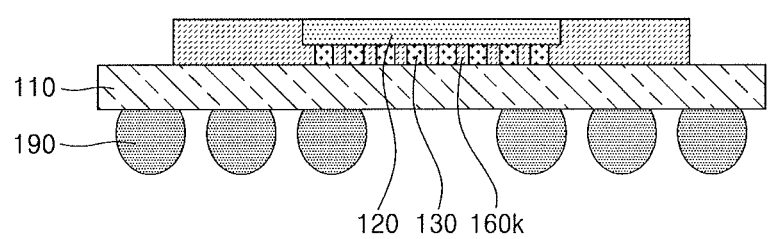
FIGS. 18A and 18B illustrate cross-sectional views of stages in a method of manufacturing a semiconductor package according to an embodiment.
Figure 18B:
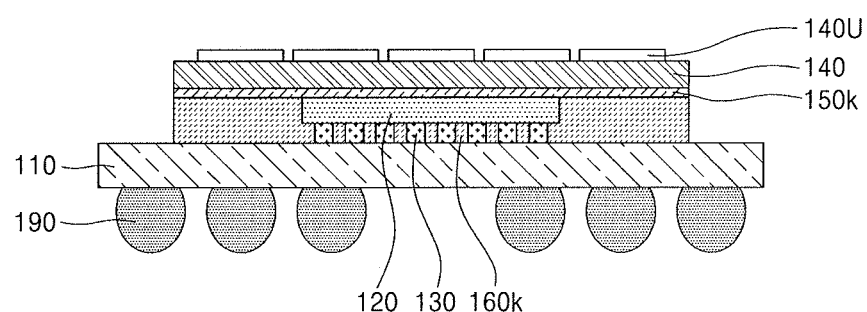

FIGS. 18A and 18B are diagrams for describing a method of manufacturing a semiconductor package according to an embodiment. Hereinafter, a method of manufacturing the semiconductor package 10000 illustrated in FIG. 10 will be described.

Referring to FIG. 18A, the lower filling layer 160k may be formed so that the upper surface of the first semiconductor chip 120 and the upper surface of the lower filling layer 160k are coplanar. In some embodiments, the first semiconductor chip 120 may be attached on the first package substrate 110, and then, the lower filling layer 160k may be formed so that the lower filling layer 160k surrounds the first semiconductor chip 120, and the upper surface of the first semiconductor chip 120 and the upper surface of the lower filling layer 160k are coplanar. In some other embodiments, the first semiconductor chip 120 with the lower filling layer 160k attached thereon may be attached on the first package substrate 110 with the lower filling layer 160k facing the first package substrate 110. Subsequently, a tape may be attached on the upper surface of the first semiconductor chip 120 and the upper surface of the lower filling layer 160k, and pressure may be applied to the tape. Subsequently, when the tape is removed, the upper surface of the first semiconductor chip 120 and the upper surface of the lower filling layer 160k may be coplanar.

Referring to FIG. 18B, the interposer 140 with the upper filling layer 150k attached thereon may be attached on the first semiconductor chip 120 in order for the upper filling layer 150k to face the first semiconductor chip 120. Processes subsequent thereto are the same as the method of manufacturing the semiconductor package 1000a illustrated in FIG. 1A, and thus, their detailed descriptions are omitted.

Figure 19A:
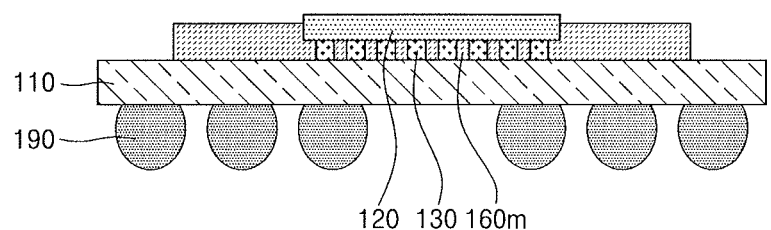
FIGS. 19A to 19C illustrate cross-sectional views of stages in a method of manufacturing a semiconductor package according to an embodiment.
Figure 19B:
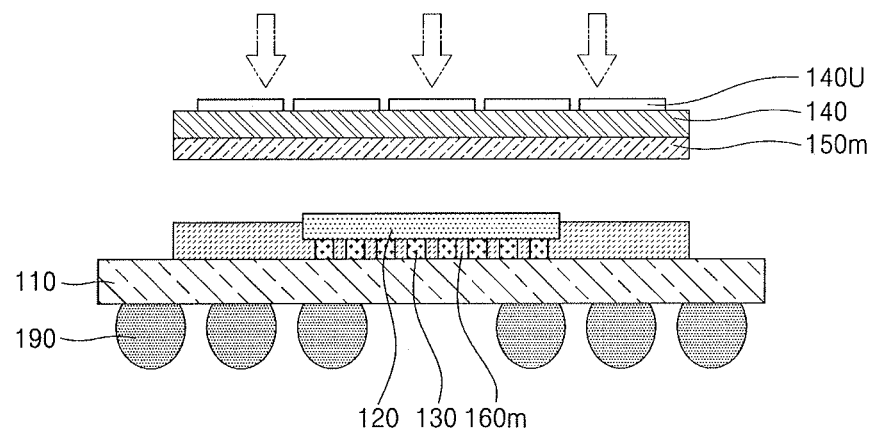
Figure 19C:
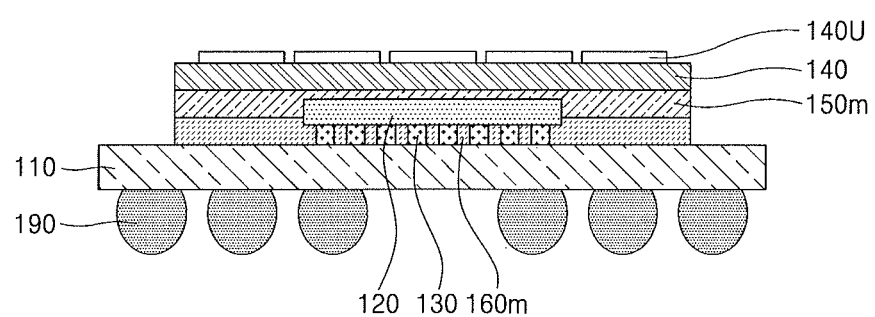

FIGS. 19A to 19C are diagrams for describing a method of manufacturing a semiconductor package according to an embodiment. Hereinafter, a method of manufacturing the semiconductor package 11000 illustrated in FIG. 11 will be described.

Referring to FIG. 19A, the lower filling layer 160m may be formed to cover only a portion of the sidewall of the first semiconductor chip 120. In some embodiments, the first semiconductor chip 120 may be attached on the first package substrate 110, and the lower filling layer 160m may be formed on the first package substrate 110 in order for the lower filling layer 160m to cover only a portion of the sidewall of the first semiconductor chip 120.

Referring to FIGS. 19B-19C, the upper filling layer 150m may be attached on the lower surface of the interposer 140. Subsequently, the interposer 140 with the upper filling layer 150m attached thereon may be placed on the first semiconductor chip 120 in order for the upper filling layer 150m to face the first semiconductor chip 120, and by applying pressure to the interposer 140, the upper filling layer 150m may cover another portion of the sidewall of the first semiconductor chip 120.

By way of summation and review, example embodiments provide a semiconductor package in which deflection of an interposer in a package is reduced. That is, support is provided between a substrate and a portion of the interposer 140 overhanging the first semiconductor chip 120 to reduce deflection of the overhanging portion. The support may include a thick portion of an upper filling layer, a protrusion protruding from the substrate, a lower filling layer between the semiconductor chip and the substrate that extends toward the interposer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first package substrate;
   a first semiconductor chip on the first package substrate;
   a plurality of first chip connection units to connect the first package substrate to the first semiconductor chip, the plurality of first chip connection units being in direct contact with a bottom of the first semiconductor chip and a top of the first package substrate;
   an interposer on the first semiconductor chip, the interposer having a width greater than a width of the first semiconductor chip in a direction parallel to an upper surface of the first package substrate;
   an upper filling layer including a center portion and an outer portion, the center portion being between the first semiconductor chip and the interposer, and the outer portion surrounding the center portion and having a thickness greater than a thickness of the center portion in a direction perpendicular to the upper surface of the first package substrate;
   a second package substrate on the interposer;
   an inter-package connection unit in direct contact with a bottom of the second package substrate and in contact with a top of the interposer; and
   at least one second semiconductor chip on the second package substrate,
   wherein a volume of the inter-package connection unit is greater than a volume of each of the plurality of first chip connection units.

2. The semiconductor package as claimed in claim 1, wherein the outer portion of the upper filling layer is in direct contact with a lower surface of the interposer and with a sidewall of the first semiconductor chip.

3. The semiconductor package as claimed in claim 1, wherein a width of the upper filling layer in the direction parallel to the upper surface of the first package substrate is the same as a width of the interposer in the direction parallel to the upper surface of the first package substrate.

4. The semiconductor package as claimed in claim 1, wherein the upper filling layer is spaced apart from the first package substrate.

5. The semiconductor package as claimed in claim 1, wherein the upper filling layer is in contact with the first package substrate.

6. The semiconductor package as claimed in claim 5, wherein:
   the first package substrate includes a base portion and a protrusion protruding upward from an upper surface of the base portion, and
   the upper filling layer is in contact with the protrusion of the first package substrate.

7. The semiconductor package as claimed in claim 6, wherein the protrusion of the first package substrate has a closed-loop shape in a plan view.

8. The semiconductor package as claimed in claim 6, wherein a width of the protrusion in the direction parallel to the upper surface of the first package substrate is greater than a height of the protrusion in the direction perpendicular to the upper surface of the first package substrate.

9. The semiconductor package as claimed in claim 1, wherein the upper filling layer is in contact with an entire upper surface of the first semiconductor chip and an entire lower surface of the interposer.

10. The semiconductor package as claimed in claim 1, further comprising a lower filling layer between the first package substrate and the first semiconductor chip, the lower filling layer surrounding the plurality of first chip connection units.

11. The semiconductor package as claimed in claim 10, wherein the lower filling layer is in contact with the upper filling layer.

12. The semiconductor package as claimed in claim 10, wherein the lower filling layer is in contact with at least a portion of a sidewall of the first semiconductor chip.

13. The semiconductor package as claimed in claim 1, further comprising a molding unit surrounding the first semiconductor chip and the interposer, the molding unit being different from the upper filling layer.

14. The semiconductor package as claimed in claim 1, wherein the upper filling layer is directly between an upper surface of the first semiconductor chip and a lower surface of the interposer.

\* \* \* \* \*